US012765017B2

(12) United States Patent
Yoo

(10) Patent No.: US 12,765,017 B2
(45) Date of Patent: Oct. 13, 2026

(54) SEMICONDUCTOR DEVICE HAVING VERTICALLY STACKED CHANNELS CONNECTED TO A MULTI-LAYER SOURCE/DRAIN PATTERN WITH AN ACTIVE CONTACT RECESSED THEREIN

(71) Applicant: Samsung Electronics Co., Ltd., Suwon-si (KR)

(72) Inventor: Jongryeol Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 415 days.

(21) Appl. No.: 18/462,851

(22) Filed: Sep. 7, 2023

(65) Prior Publication Data

US 2024/0274665 A1 Aug. 15, 2024

(30) Foreign Application Priority Data

Feb. 10, 2023 (KR) ........................ 10-2023-0017899

(51) Int. Cl.
*H10D 30/67* (2025.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC ....... H10D 30/43–435; H10D 30/6757; H10D 30/6735; H10D 30/501–509;
(Continued)

(56) References Cited

U.S. PATENT DOCUMENTS 10,672,868 B2 6/2020 Jambunathan et al.
10,832,907 B2 11/2020 Cheng et al.
(Continued)

FOREIGN PATENT DOCUMENTS

KR 10-2020-0111997 A 10/2020
KR 10-2021-0133850 A 11/2021
(Continued)

OTHER PUBLICATIONS

Office Action for Korean Application No. 10-2023-0017899 dated Sep. 3, 2026.

*Primary Examiner* — Younes Boulghassoul
(74) *Attorney, Agent, or Firm* — Harness, Dickey & Pierce, P.L.C.

(57) ABSTRACT

A semiconductor device may include a substrate, a channel pattern on the substrate, a source/drain pattern, an interlayer insulating pattern on the source/drain pattern, and an active contact penetrating the interlayer insulating layer and being electrically connected to the source/drain pattern. The channel pattern may include a plurality of semiconductor patterns. The plurality of semiconductor patterns may be vertically stacked and spaced apart from each other. A lowermost one of the plurality of semiconductor patterns may be a first semiconductor pattern. The source/drain pattern may be connected to the plurality of semiconductor patterns. A level of a bottommost surface of the active contact may be lower than a top surface of the first semiconductor pattern.

17 Claims, 36 Drawing Sheets

(51) Int. Cl.

| | |
|---|---|
| ***H10D 30/43*** | (2025.01) |
| ***H10D 30/69*** | (2025.01) |
| ***H10D 62/10*** | (2025.01) |
| ***H10D 62/13*** | (2025.01) |
| ***H10D 64/01*** | (2025.01) |
| ***H10D 64/23*** | (2025.01) |
| ***H10D 64/62*** | (2025.01) |

(52) U.S. Cl.
CPC ..... *H10D 30/6713* (2025.01); *H10D 30/6735* (2025.01); *H10D 30/6757* (2025.01); *H10D 30/797* (2025.01); *H10D 62/121* (2025.01); *H10D 64/017* (2025.01); *H10D 64/251* (2025.01); *H10D 64/256* (2025.01); *H10D 64/62* (2025.01)

(58) Field of Classification Search
CPC ..... H10D 30/014; H10D 30/019–0198; H10D 62/119–123; H10D 84/851; H10D 84/852; H10D 84/832; H10D 84/833; H10D 62/151; H10D 62/021; H10D 84/013; H10D 84/0133; H10D 84/017; H10D 30/6713; H10D 30/0223; H10D 30/797; H10D 30/6219; H10D 30/6729; H10D 64/251–259; H10D 84/0149; H10D 84/0186; H10D 64/256
See application file for complete search history.

(56) References Cited

U.S. PATENT DOCUMENTS

| | | | | |
|---|---|---|---|---|
| 11,094,800 | B2 | 8/2021 | Son et al. | |
| 11,158,716 | B2 | 10/2021 | Son et al. | |
| 11,201,225 | B2 | 12/2021 | Chiang et al. | |
| 11,251,308 | B2 | 2/2022 | Liao et al. | |
| 11,289,606 | B2 | 3/2022 | Ju et al. | |
| 11,398,553 | B2 | 7/2022 | Lin et al. | |
| 11,522,071 | B2 | 12/2022 | Kim et al. | |
| 2021/0098583 | A1* | 4/2021 | Tsai | H10D 30/6219 |
| 2021/0104524 | A1* | 4/2021 | Hwang | H10D 30/6735 |
| 2021/0376093 | A1 | 12/2021 | Chu et al. | |
| 2022/0069078 | A1* | 3/2022 | Yu | H10D 62/116 |
| 2022/0165729 | A1* | 5/2022 | Shin | H10D 64/518 |
| 2022/0173253 | A1* | 6/2022 | Yeom | H10D 30/6757 |
| 2022/0199775 | A1* | 6/2022 | Park | H10D 62/151 |
| 2022/0216150 | A1* | 7/2022 | Shin | H10D 30/6757 |
| 2022/0254781 | A1* | 8/2022 | Song | H10D 84/0177 |
| 2022/0285493 | A1* | 9/2022 | Kim | H10D 62/118 |
| 2022/0319907 | A1* | 10/2022 | Lee | H10D 84/038 |
| 2022/0359678 | A1* | 11/2022 | Kim | H10D 30/6729 |
| 2022/0416082 | A1* | 12/2022 | Jung | H10D 30/797 |
| 2023/0011153 | A1* | 1/2023 | Kim | H10D 62/118 |
| 2023/0115743 | A1* | 4/2023 | Lee | H10D 30/6713 257/288 |
| 2023/0187508 | A1* | 6/2023 | Xie | H10D 30/43 257/622 |
| 2023/0207654 | A1* | 6/2023 | Lee | H10D 30/014 257/347 |
| 2023/0395717 | A1* | 12/2023 | Rachmady | H10D 30/6757 |
| 2024/0128355 | A1* | 4/2024 | Breil | H10D 30/6735 |
| 2024/0162308 | A1* | 5/2024 | Shen | H10D 62/121 |
| 2024/0204068 | A1* | 6/2024 | Na | H10D 64/258 |
| 2024/0282708 | A1 | 8/2024 | Yoo | |

FOREIGN PATENT DOCUMENTS

| | | | |
|---|---|---|---|
| KR | 2023-0007702 | A | 1/2023 |
| KR | 10-2024-0130449 | A | 8/2024 |

* cited by examiner

SEMICONDUCTOR DEVICE HAVING VERTICALLY STACKED CHANNELS CONNECTED TO A MULTI-LAYER SOURCE/DRAIN PATTERN WITH AN ACTIVE CONTACT RECESSED THEREIN

CROSS-REFERENCE TO RELATED APPLICATIONS

This U.S. non-provisional patent application claims priority under 35 U.S.C. § 119 to Korean Patent Application No. 10-2023-0017899, filed on Feb. 10, 2023, in the Korean Intellectual Property Office, the entire contents of which are hereby incorporated by reference.

BACKGROUND

The present disclosure relates to a semiconductor device and a method of fabricating the same, and in particular, to a semiconductor device including a field effect transistor and a method of fabricating the same.

A semiconductor device may include an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize semiconductor devices with high performance.

SUMMARY

An embodiment of inventive concepts provides a semiconductor device with improved reliability and/or electric characteristics.

An embodiment of inventive concepts provides a method of fabricating a semiconductor device with improved reliability and/or electric characteristics.

According to an embodiment of inventive concepts, a semiconductor device may include a substrate, a channel pattern on the substrate, a source/drain pattern, an interlayer insulating pattern on the source/drain pattern, and an active contact penetrating the interlayer insulating layer and being electrically connected to the source/drain pattern. The channel pattern may include a plurality of semiconductor patterns. The plurality of semiconductor patterns may be vertically stacked and spaced apart from each other. A lowermost one of the plurality of semiconductor patterns may be a first semiconductor pattern. The source/drain pattern may be connected to the plurality of semiconductor patterns. A level of a bottommost surface of the active contact may be lower than a top surface of the first semiconductor pattern.

According to an embodiment of inventive concepts, a semiconductor device may include a substrate including an active region; a source/drain pattern on the active region, the source/drain pattern including a first inner surface, the source/drain pattern being among a plurality of source/drain patterns; channel patterns on the active region and connected to the plurality of source/drain patterns, each of the channel patterns including a plurality of semiconductor patterns, the plurality of semiconductor patterns being vertically stacked and spaced apart from each other, and a lowermost one of the semiconductor patterns being a first semiconductor pattern; gate electrodes on the channel patterns, respectively; an active contact electrically connected to the source/drain pattern; and an intermediate layer on the first inner surface. The active contact may be on the intermediate layer. A level of a bottom surface of the first inner surface may be lower than a top surface of the first semiconductor pattern.

According to an embodiment of inventive concepts, a semiconductor device may include a substrate including an active region; a device isolation layer on the active region, the device isolation layer defining an active pattern on the active region; a channel pattern on the active pattern, the channel pattern including a plurality of semiconductor patterns, the plurality of semiconductor patterns being vertically stacked and spaced apart from each other, a lowermost one of the plurality of semiconductor patterns being a first semiconductor pattern; a source/drain pattern on the active pattern; a gate electrode on the plurality of semiconductor patterns, the gate electrode including a portion interposed between adjacent semiconductor patterns among the plurality of semiconductor patterns; a gate insulating layer between the adjacent semiconductor patterns and the portion of the gate electrode; an inner spacer between the gate insulating layer and the source/drain pattern; a gate spacer on a side surface of the gate electrode; a gate capping pattern on a top surface of the gate electrode; an interlayer insulating layer on the gate capping pattern; an active contact penetrating the interlayer insulating layer and being electrically connected to the source/drain pattern; a metal layer between the active contact and the source/drain pattern; a gate contact penetrating the interlayer insulating layer and the gate capping pattern, the gate contact being electrically connected to the gate electrode; a first metal layer on the interlayer insulating layer, the first metal layer including a power line and a first interconnection line, the power line and the first interconnection line being electrically connected to the active contact and gate contact; and a second metal layer on the first metal layer. The second metal layer may include second interconnection lines electrically connected to the first metal layer. A level of a lowermost portion of the active contact may be lower than a level of a top surface of the first semiconductor pattern.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
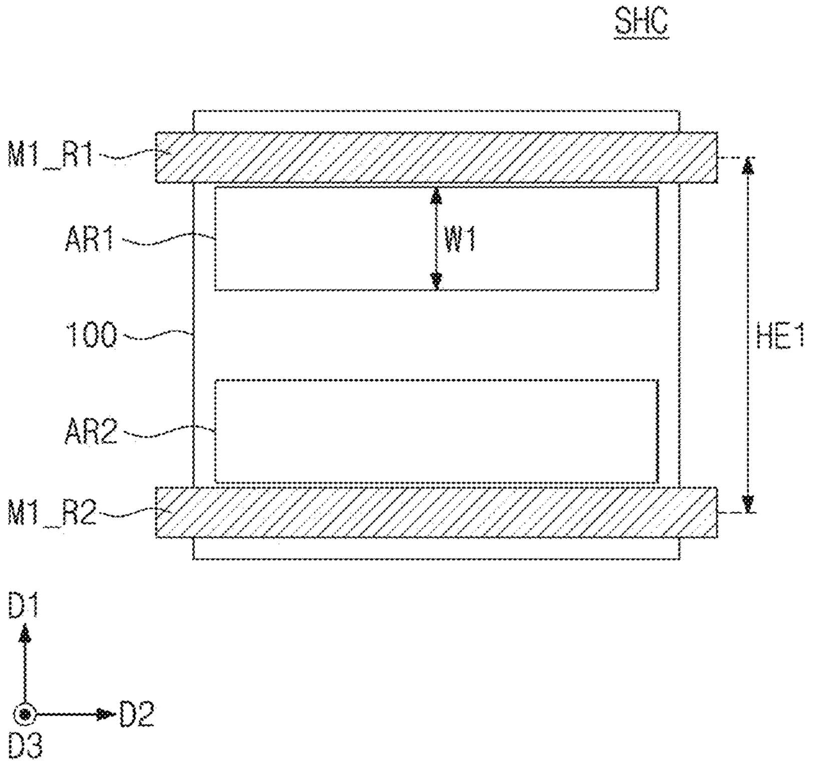
FIGS. 1 to 3 are conceptual diagrams illustrating logic cells of a semiconductor device according to an embodiment of inventive concepts.
Figure 2:
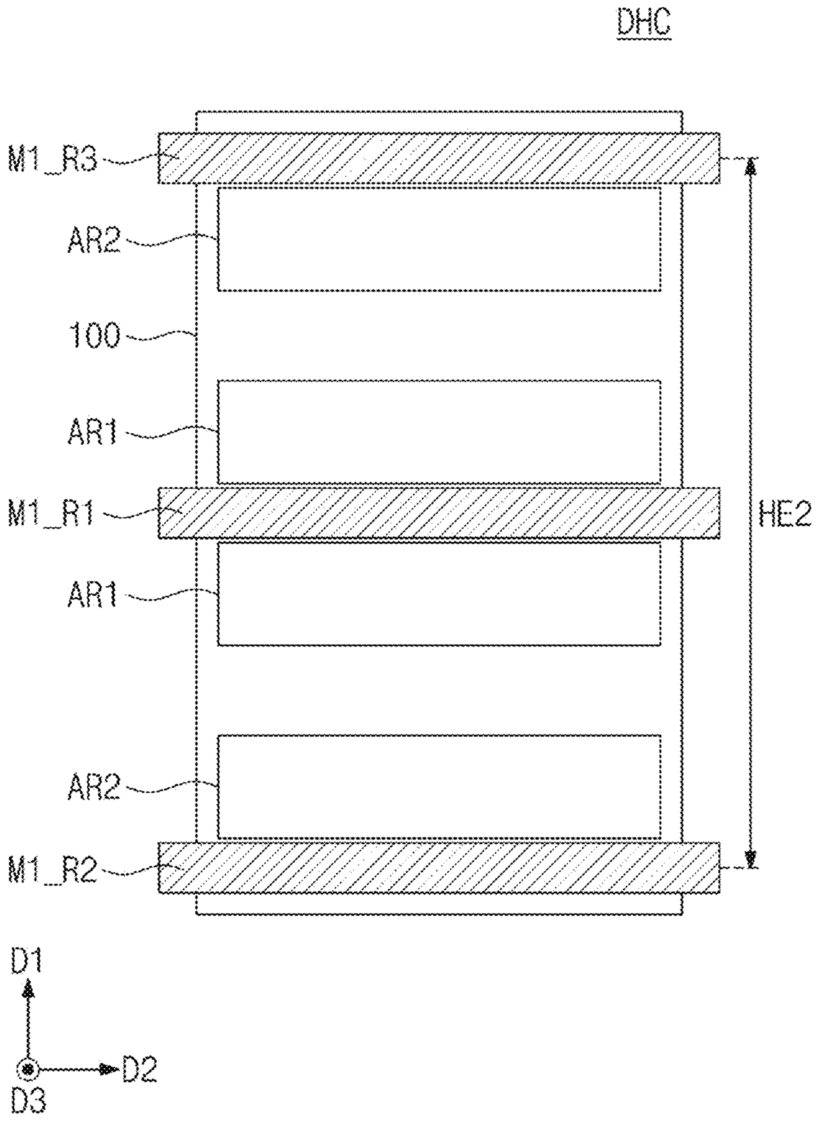
Figure 3:
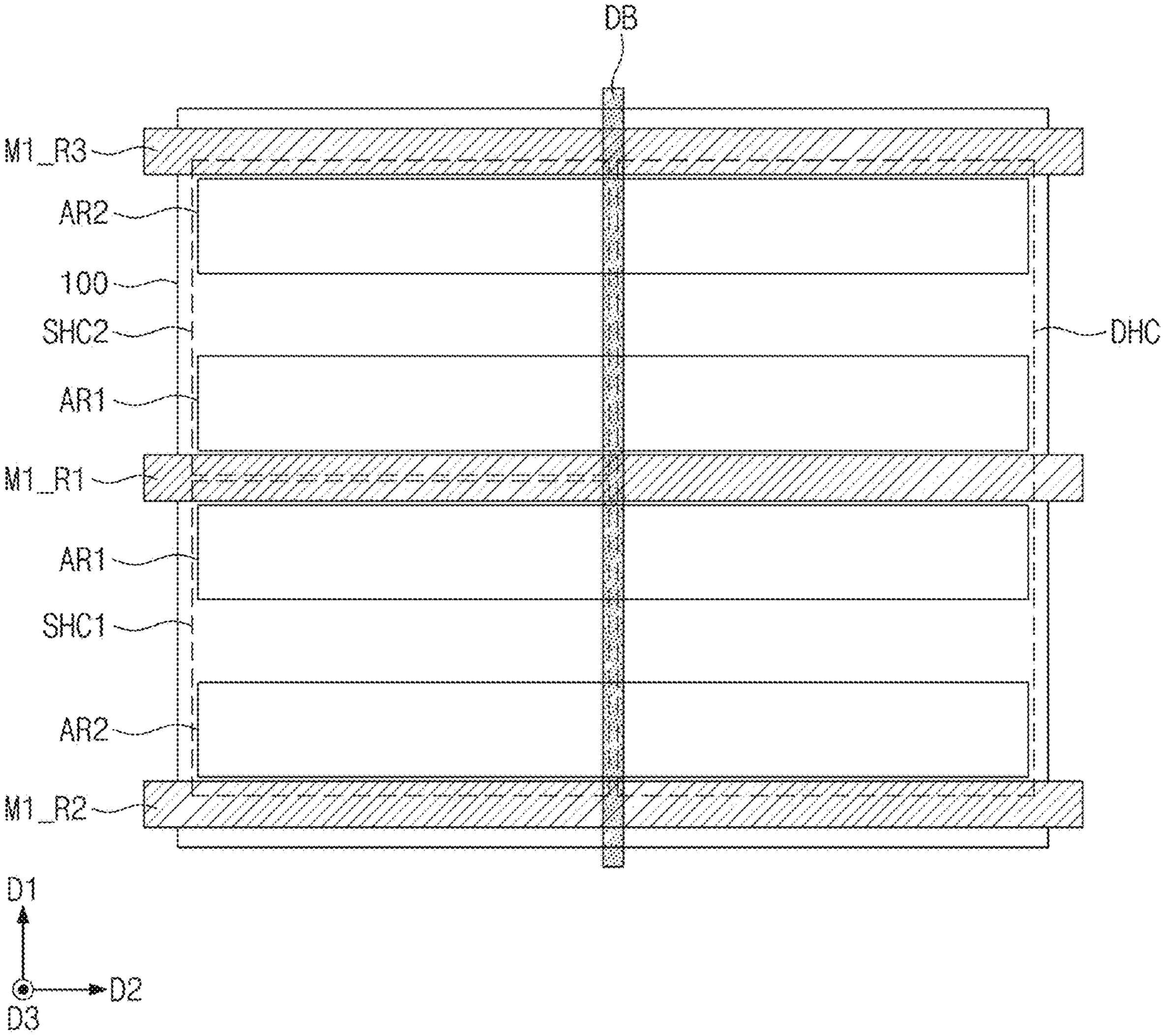

FIGS. 1 to 3 are conceptual diagrams illustrating logic cells of a semiconductor device according to an embodiment of inventive concepts.

Referring to FIG. 1, a single height cell SHC may be provided. In detail, a first power line M1_R1 and a second power line M1_R2 may be provided on a substrate 100. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other may be an NMOSFET region. In other words, the single height cell SHC may have a CMOS structure provided between the first and second power lines M1_R1 and M1_R2.

Each of the first and second active regions AR1 and AR2 may have a first width W1 in a first direction D1. A length of the single height cell SHC in the first direction D1 may be defined as a first height HEL. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the second active regions AR2 may be adjacent to the second power line M1_R2. The other of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be defined as a second height HE2. The second height HE2 may be about two times the first height HE1 of FIG. 1. The pair of the first active regions AR1 of the double height cell DHC may be combined to serve as a single active region.

In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
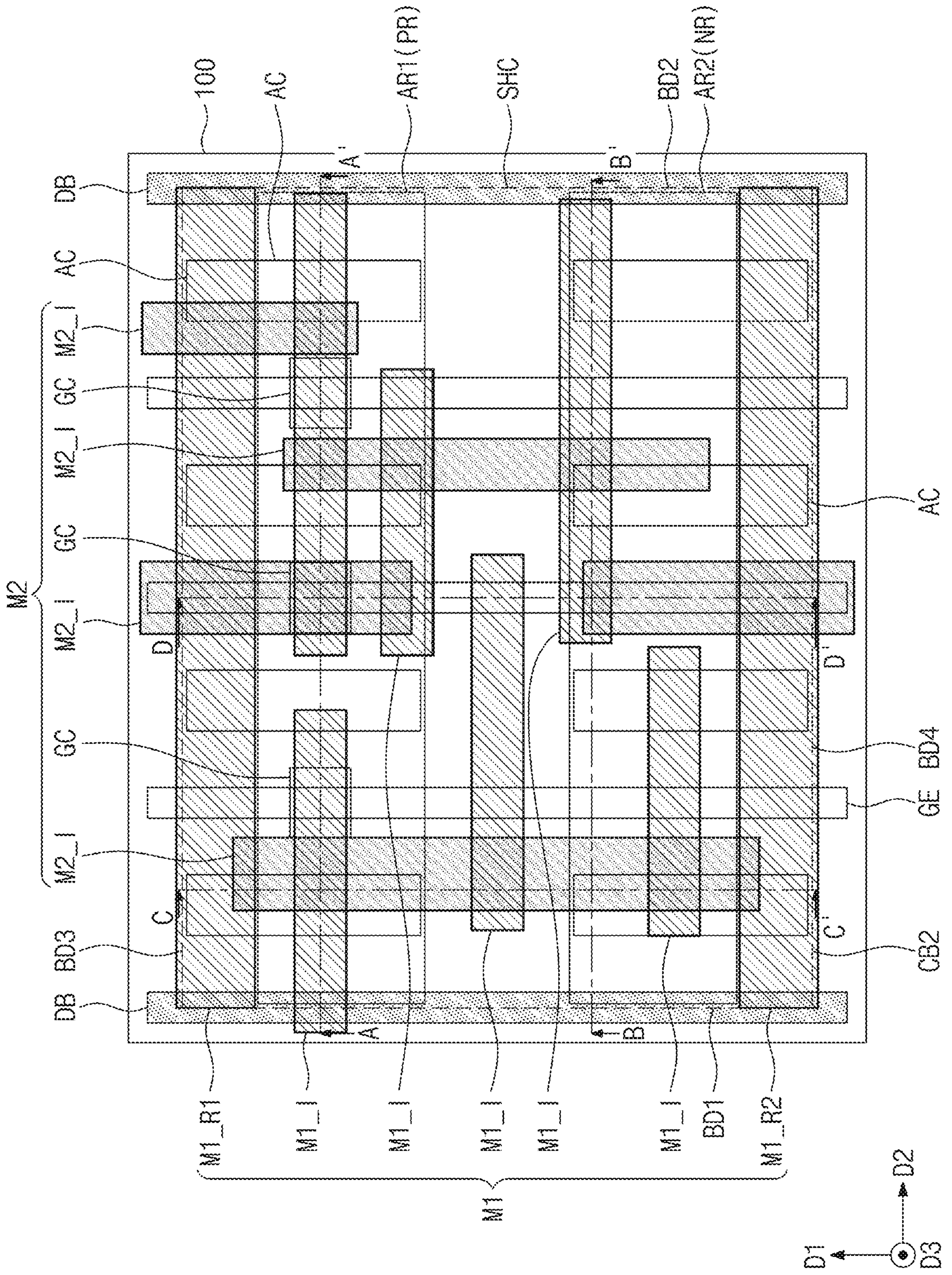
FIG. 4 is a plan view illustrating a semiconductor device according to an embodiment of inventive concepts.
Figure 5A:
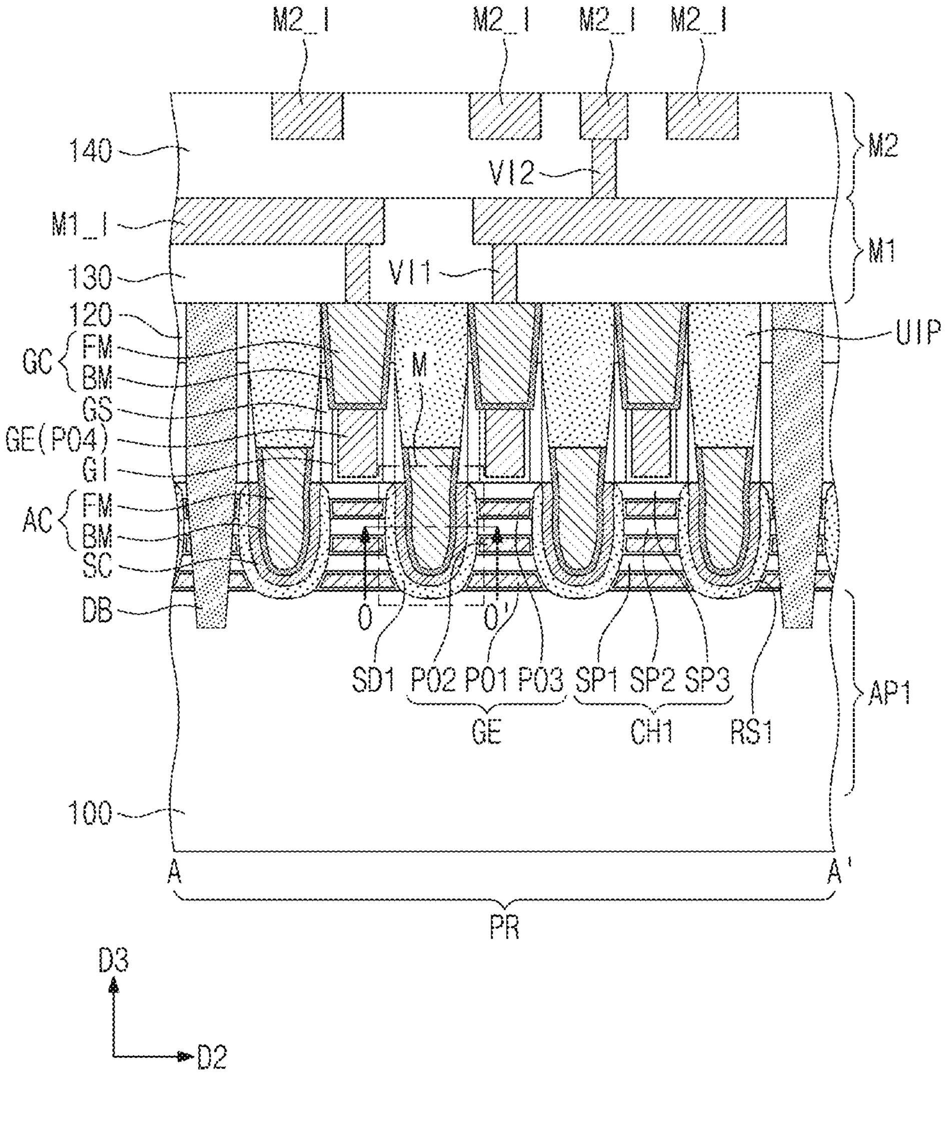
FIGS. 5A to 5D are sectional views, which are respectively taken along lines A-A', B-B', C-C', and D-D' of FIG. 4.
Figure 5B:
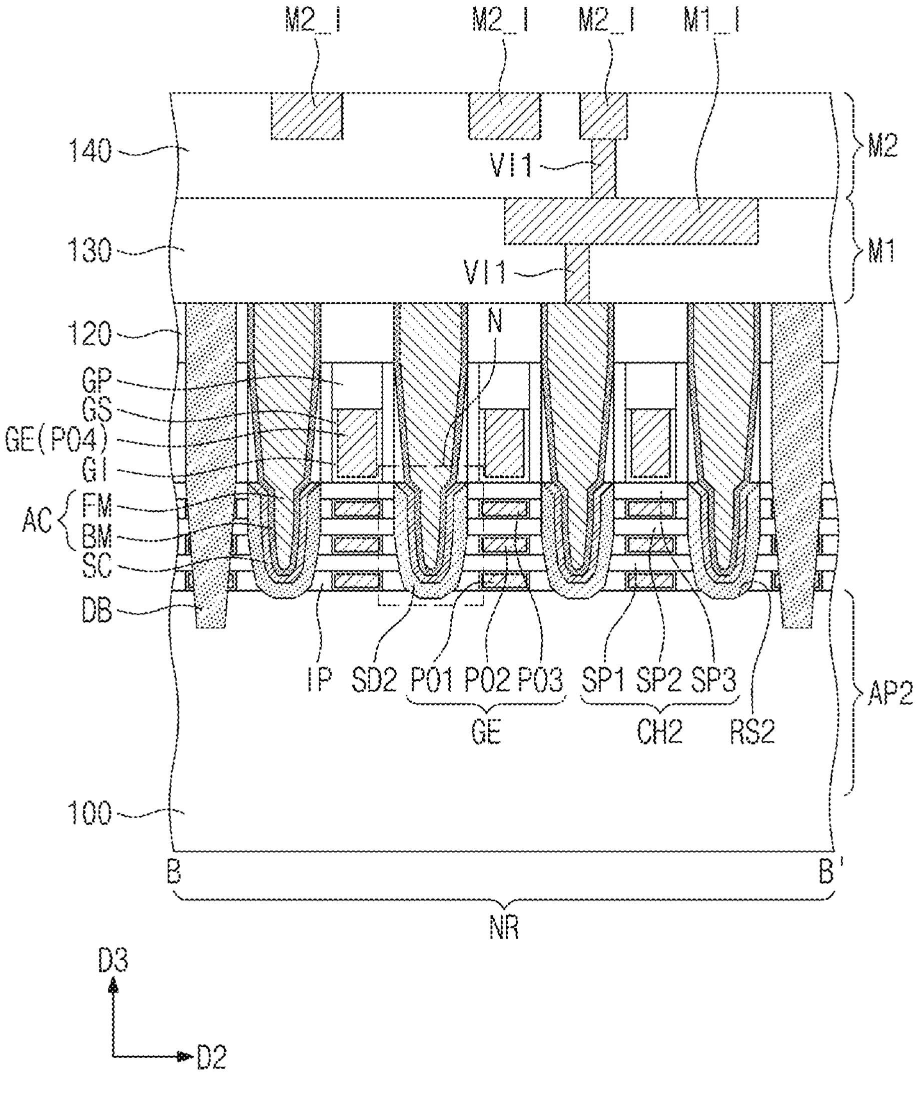
Figure 5C:
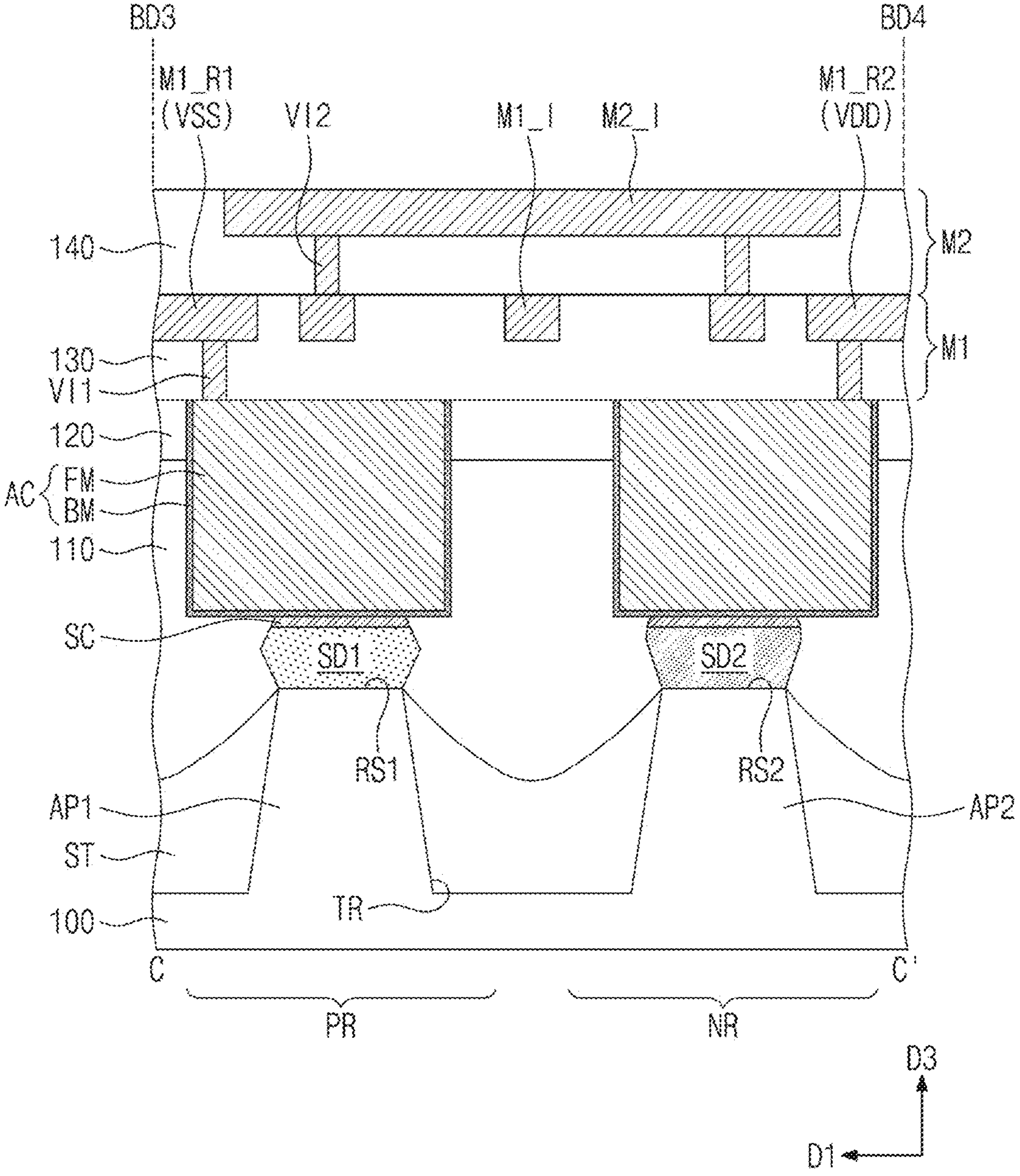
Figure 6A:
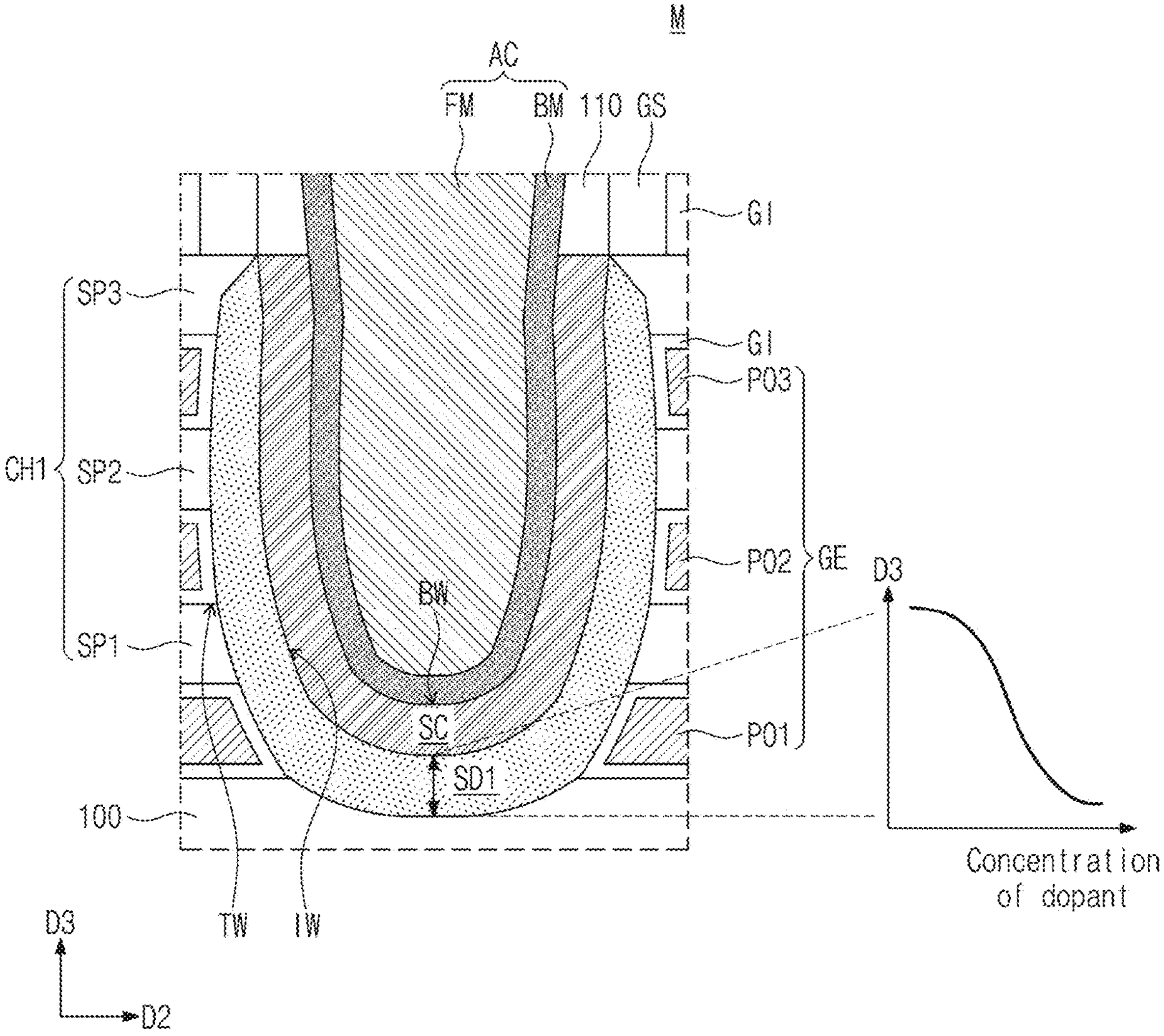
FIGS. 6A and 6B are enlarged sectional views, each illustrating a portion 'M' of FIG. 5A according to an embodiment of inventive concepts.
Figure 6B:
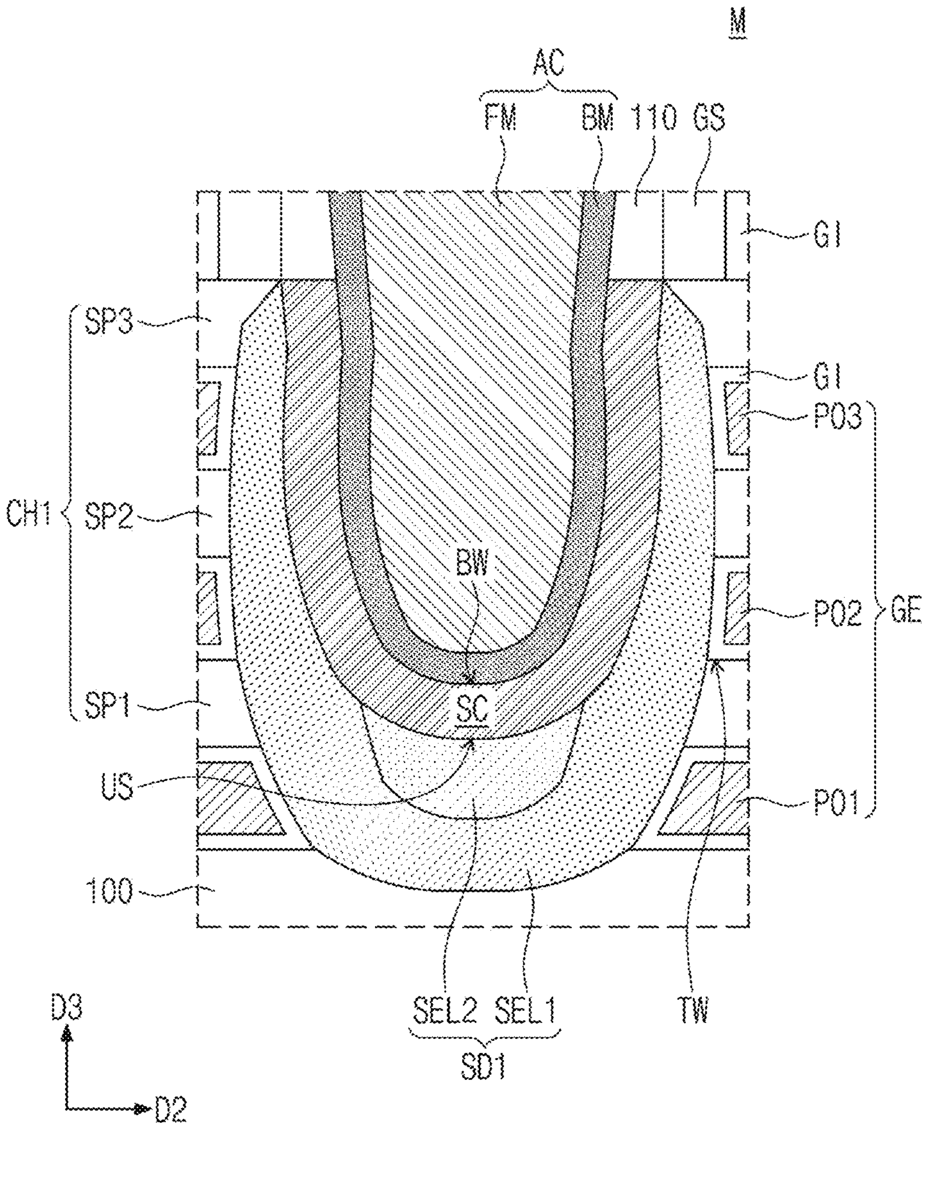
Figure 7:
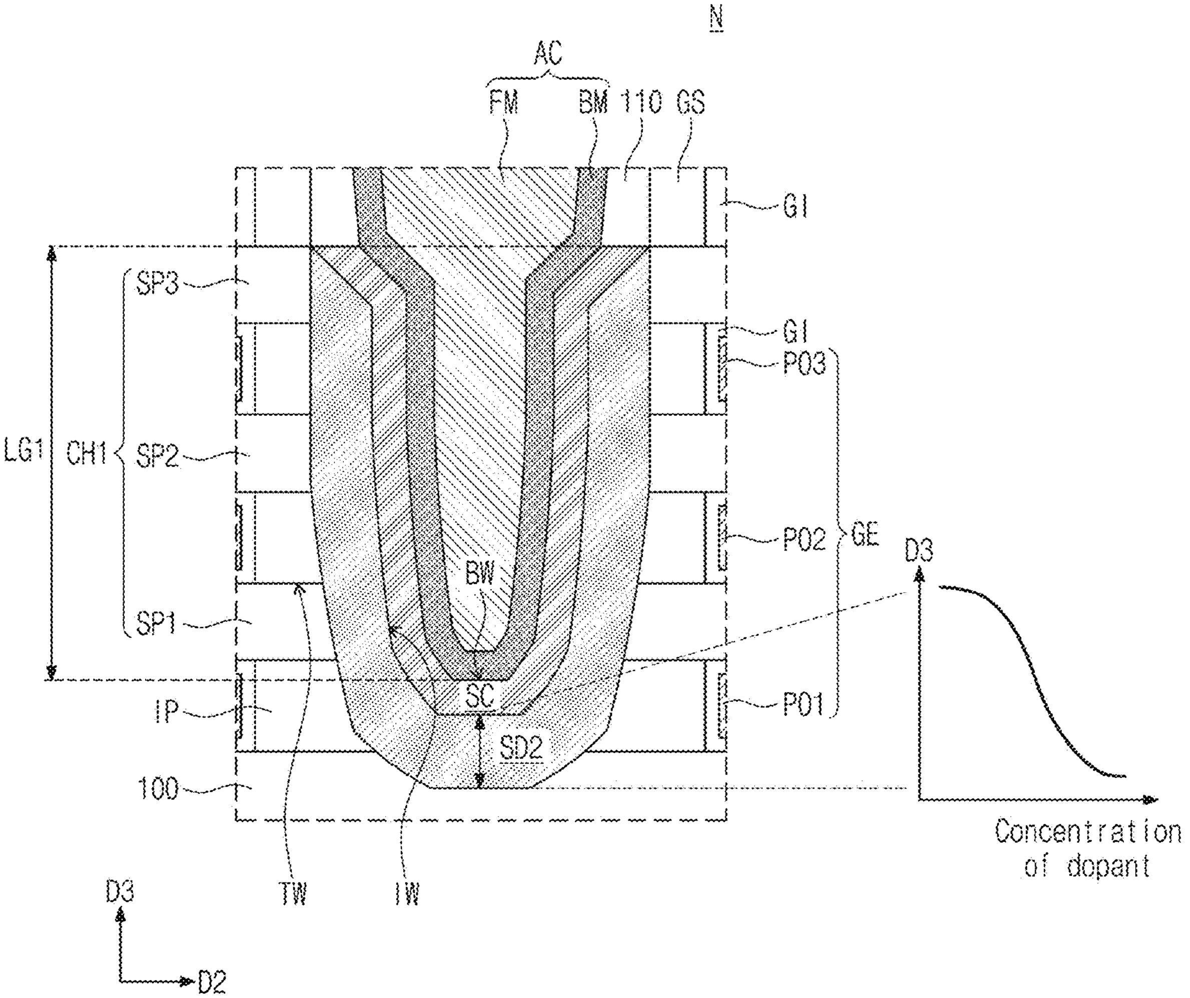
FIG. 7 is an enlarged sectional view illustrating a portion 'N' of FIG. 5B according to an embodiment of inventive concepts.
Figure 8:
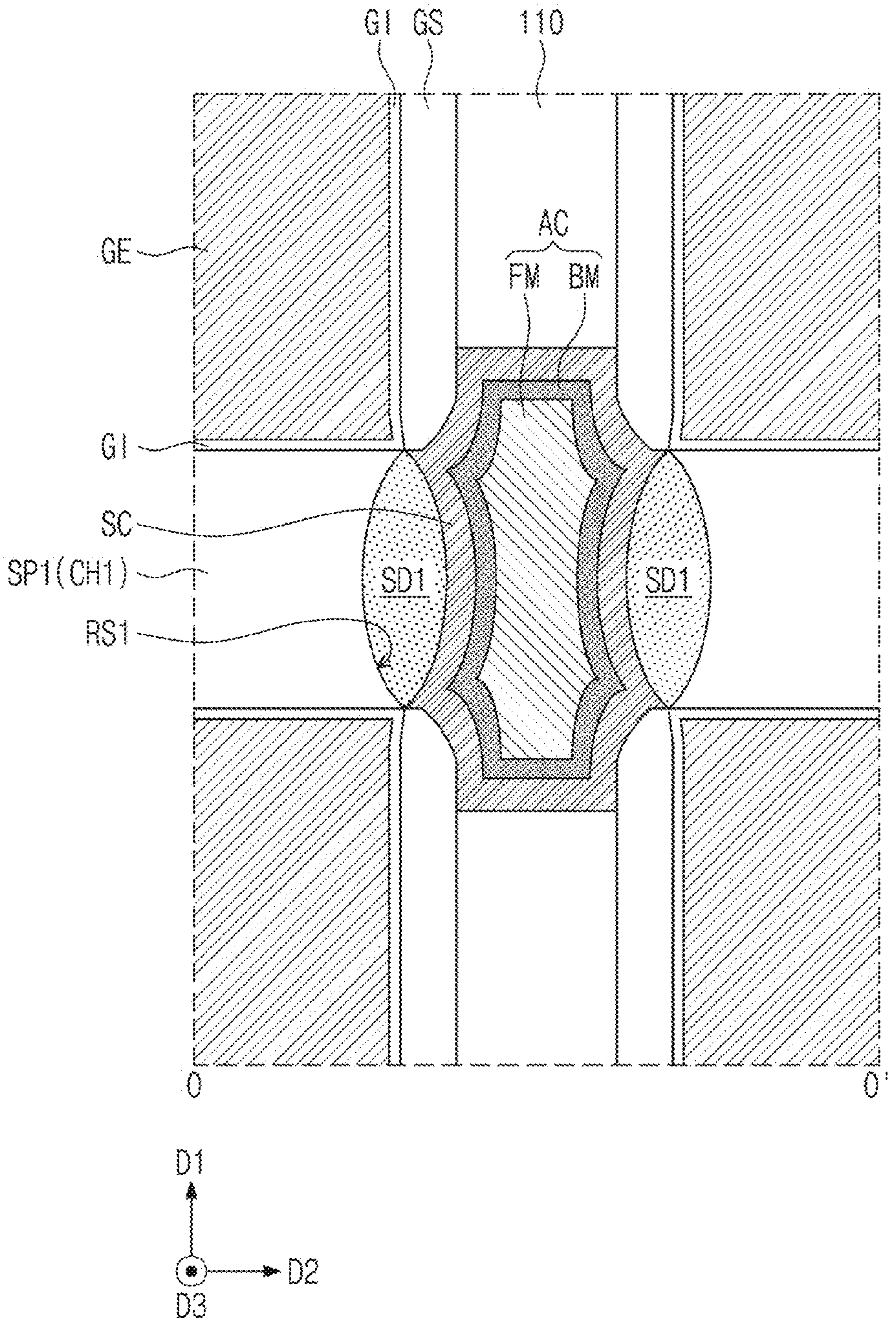
FIG. 8 is a sectional view taken along a line O-O' of FIG. 5A.

FIG. 4 is a plan view illustrating a semiconductor device according to an embodiment of inventive concepts. FIGS. 5A to 5D are sectional views, which are respectively taken along lines A-A', B-B', C-C', and D-D' of FIG. 4. FIGS. 6A and 6B are enlarged sectional views, each illustrating a portion 'M' of FIG. 5A according to an embodiment of inventive concepts. FIG. 7 is an enlarged sectional view illustrating a portion 'N' of FIG. 5B according to an embodiment of inventive concepts. FIG. 8 is a sectional view taken along a line O-O' of FIG. 5A. The semiconductor device of FIGS. 4 and 5A to 5D may be a concrete example of the single height cell SHC of FIG. 1.

Referring to FIGS. 4 and 5A to 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first active region AR1 and the second active region AR2. Each of the first and second active regions AR1 and AR2 may be extended in the second direction D2. In an embodiment, the first active region AR1 may be a PMOSFET region, and the second active region AR2 may be an NMOSFET region.

A first active pattern AP1 and a second active pattern AP2 may be defined by a trench TR, which is formed in an upper portion of the substrate 100. The first active pattern AP1 may be provided on the PMOSFET region, and the second active pattern AP2 may be provided on the NMOSFET region. The first and second active patterns AP1 and AP2 may be extended in the second direction D2. Each of the first and second active patterns AP1 and AP2 may be a vertically-protruding portion of the substrate 100.

A device isolation layer ST may be provided on the substrate 100. The device isolation layer ST may be provided to fill the trench TR. The device isolation layer ST may include a silicon oxide layer. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3). The first semiconductor pattern SP1 may be the lowermost one of the semiconductor patterns, and the third semiconductor pattern SP3 may be the uppermost one of the semiconductor patterns.

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (e.g., single crystalline silicon). In an embodiment, the first to third semiconductor patterns SP1, SP2, and SP3 may be a stack of nanosheets.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or include a semiconductor material whose lattice constant is greater than that of the substrate 100. For example, the first source/drain patterns SD1 may be formed of or include at least one of silicon (Si) or silicon-germanium (SiGe). Accordingly, each pair of the first source/drain patterns SD1 may exert a compressive stress on the first channel pattern CH1 therebetween. The second source/drain patterns SD2 may be formed of or include the same semiconductor material as the substrate 100. In an embodiment, the second source/drain patterns SD2 may be formed of or include at least one of silicon-arsenic (SiAs) or silicon-phosphorus (SiP).

Gate electrodes GE may be provided on the first and second channel patterns CH1 and CH2. Each of the gate electrodes GE may be extended in the first direction D1 to cross the first and second channel patterns CH1 and CH2. Each of the gate electrodes GE may be vertically overlapped with the first and second channel patterns CH1 and CH2. The gate electrodes GE may be arranged at a first pitch in the second direction D2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
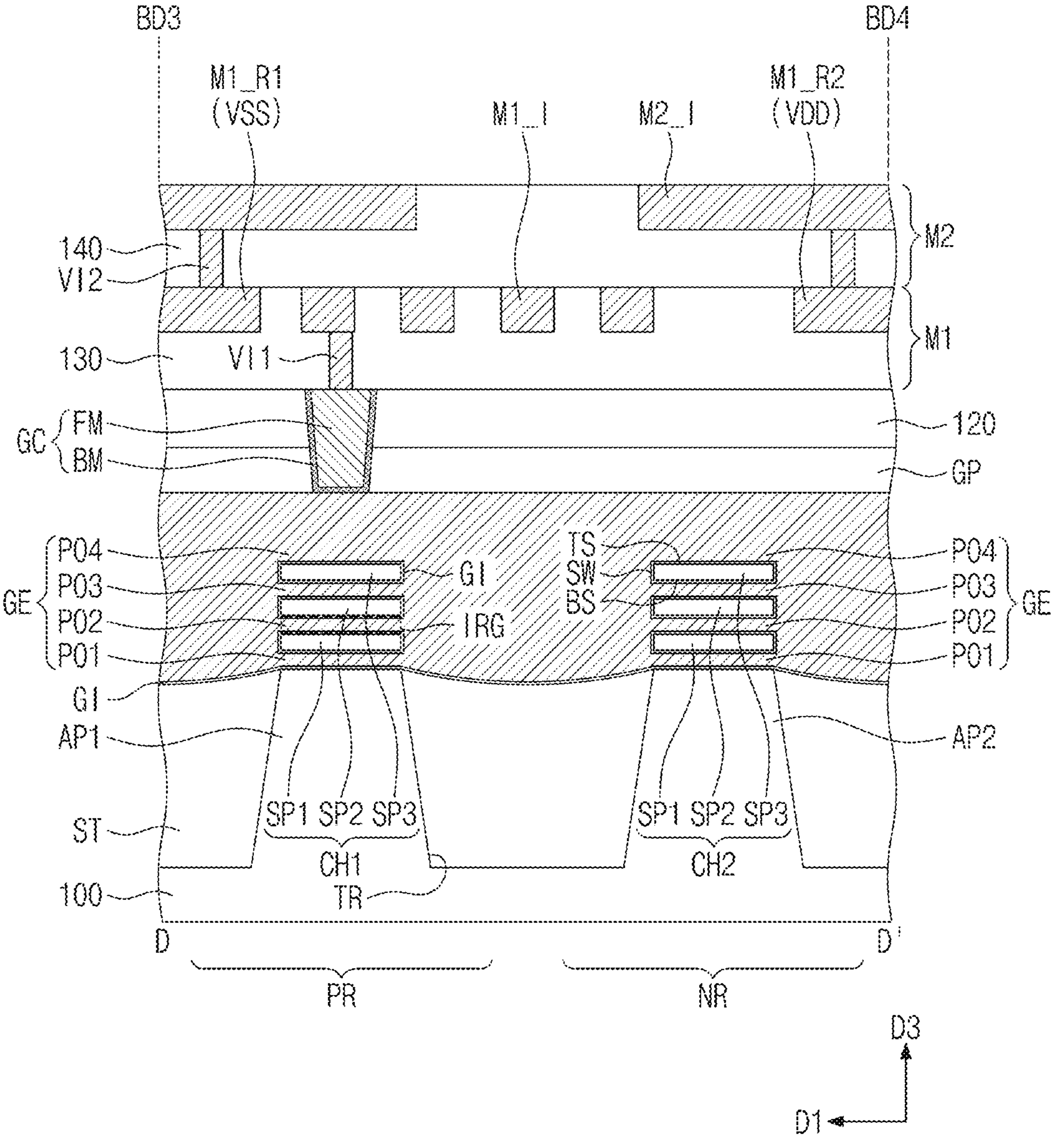

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

On the NMOSFET region, inner spacers IP may be respectively interposed between the first to third portions PO1, PO2, and PO3 of the gate electrode GE and the second source/drain pattern SD2. Each of the first to third portions PO1, PO2, and PO3 of the gate electrode GE may be spaced apart from the second source/drain pattern SD2 with the inner spacer IP interposed therebetween. The inner spacer IP may limit and/or prevent a leakage current from the gate electrode GE.

Referring to FIGS. 4 and 5A to 5D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In another embodiment, the gate spacers GS may be a multi-layered structure, which is formed of or includes at least two different materials selected from SiCN, SiCON, and SiN.

Referring to FIGS. 4 and 5A to 5D, a gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE (e.g., see FIG. 5D).

In an embodiment, the gate insulating layer GI may include a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The single height cell SHC may have a first border BD1 and a second border BD2, which are opposite to each other in the second direction D2. The first and second borders BD1 and BD2 may be extended in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at both sides of the single height cell SHC. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the single height cell SHC from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

The active contact AC and the source/drain patterns SD1 and SD2 will be described in more detail with reference to FIGS. 6A and 7. The active contact AC may be formed to penetrate the first interlayer insulating layer 110 and may be placed in the source/drain pattern SD1 or SD2. As a vertical level is lowered, a width of the active contact AC in the second direction D2 may decrease. The active contact AC may have the bottommost surface BW. The bottommost surface BW may be located at a level lower than a top surface TW of the first semiconductor pattern SP1. The bottommost surface BW may be located at a level lower than a top surface of the first portion PO1 of the gate electrode GE.

The active contact AC, which is formed in the source/drain pattern SD1 or SD2, may have a vertical length LG1. The vertical length LG1 may be a vertical distance between the bottommost surfaces of the active contact AC and topmost surfaces of the source/drain pattern SD1 or SD2. The vertical length LG1 may be smaller than the vertical distance between the bottommost and topmost surfaces of the source/drain pattern SD1 or SD2. The active contact AC may be deeply formed in a direction toward the bottom surface of the source/drain pattern SD1 or SD2. Accordingly, a contact area between the active contact AC and the source/drain pattern SD1 or SD2 may be increased, and consequently, a contact resistance between the active contact AC and the source/drain pattern SD1 or SD2 may be decreased. The vertical length LG1 of the active contact AC may be adjustable, and this will be discussed in greater detail in reference to the fabrication method provided below.

Intermediate layers SC may be respectively interposed between the active contact AC and the first source/drain pattern SD1 and between the active contact AC and the second source/drain pattern SD2. The intermediate layer SC may enclose an outer surface of the active contact AC. The intermediate layer SC may cover side and bottom surfaces of the active contact AC. The bottommost surface of the intermediate layer SC may be lower than the bottommost surface BW of the active contact AC. In an embodiment, a contact surface between the intermediate layer SC and the active contact AC and a contact surface between the intermediate layer SC and the source/drain pattern SD1 or SD2 may have a wavy profile. A top surface of the intermediate layer SC may be located at a level that is equal to or higher than a top surface of the source/drain pattern SD1 or SD2. The source/drain pattern SD1 or SD2 may include an inner surface IW in contact with the intermediate layer SC. The bottommost surface of the inner surface IW may be located at a level that is lower than the top surface TW of the first semiconductor pattern SP1. A mean thickness of the intermediate layer SC may be smaller than a mean thickness of the source/drain patterns SD1 and SD2.

The intermediate layer SC may be a metal-semiconductor compound layer (e.g., a silicide layer). The active contact AC may be electrically connected to the source/drain pattern SD1 or SD2 through the intermediate layer SC. For example, the intermediate layer SC may be formed of or include at least one of titanium-silicide, tantalum-silicide, tungsten-silicide, nickel-silicide, or cobalt-silicide.

The active contact AC may include a conductive pattern FM and a barrier pattern BM enclosing the conductive pattern FM. For example, the conductive pattern FM may be formed of or include at least one of metallic materials (e.g., aluminum, copper, tungsten, molybdenum, or cobalt). The barrier pattern BM may be provided to cover side and bottom surfaces of the conductive pattern FM. A portion of the barrier pattern BM may be interposed between the intermediate layer SC and the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Referring to FIGS. 6A to 7, the source/drain patterns SD1 and SD2 may include impurities. As a distance to the active contact AC decreases, a concentration of the impurities (e.g., dopants) in the source/drain patterns SD1 and SD2 may increase. That is, the impurity concentration may be the highest at a contact surface between the intermediate layer SC and the source/drain pattern SD1 or SD2. As a distance from the contact surface increases, the impurity concentration may decrease. The impurities in the first source/drain pattern SD1 may include at least one of boron (B), gallium (Ga), or indium (In). The impurities in the second source/drain pattern SD2 may include at least one of arsenic (As), phosphorus (P), or antimony (Sb). In an embodiment, the impurities in the source/drain patterns SD1 and SD2 may include argon (Ar) or germanium (Ge).

FIG. 6B is an enlarged sectional view illustrating a portion 'M' of FIG. 5A, according to an embodiment of inventive concepts. Referring to FIG. 6B, the first source/drain pattern SD1 may include a first layer SEL1 and a second layer SEL2. The second layer SEL2 may have a concave top surface US. The intermediate layer SC may be formed between the concave top surface US and the active contact AC and between inner side surfaces of the first layer SEL1 and the active contact AC. The concave top surface US of the second layer SEL2 may be covered with the intermediate layer SC. The first layer SEL1 may cover side and bottom surfaces of the second layer SEL2. To adjust the depth of the active contact AC in a fabrication process to be described below, the second layer SEL2 may not be wholly removed, and the afore-described structure of the first and second layers SEL1 and SEL2 may result from this partial removal of the second layer SEL2.

The second layer SEL2 may be formed of or include a sacrificial material. The sacrificial material may include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), or silicon-arsenic-carbon (SiAsC). The first layer SEL1 may be formed of or include at least one of silicon (Si) or silicon-germanium (SiGe). In an embodiment, the second layer SEL2 may have a germanium concentration higher than the first layer SEL1. For example, the germanium concentration of the first layer SEL1 may range from 0 at % to 30 at %. By contrast, the germanium concentration of the second layer SEL2 may range from 30 at % to 70 at %. In an embodiment, the first layer SEL1 may have the same germanium concentration as the second layer SEL2.

Referring to FIG. 7, an indent region IDR may be defined between each of first to third portions PO1 to PO3 of the gate electrode GE and the second source/drain pattern SD2. The indent region IDR may be an empty space, which is extended from the second source/drain pattern SD2 toward a corresponding one of the first to third portions PO1 to PO3. The inner spacer IP may be provided in each of the indent regions IDR.

FIG. 8 is a plan view, which is taken along a level depicted by a line O-O' of FIG. 5A to illustrate a planar structure of the first source/drain pattern SD1 and the active contact AC according to an embodiment of inventive concepts. The first source/drain pattern SD1 may be formed between the first semiconductor patterns SP1. The active contact AC may be provided to penetrate the first interlayer insulating layer 110 and may be extended into the first source/drain pattern SD1. The intermediate layer SC may be interposed between the active contact AC and the first source/drain pattern SD1 and may enclose the active contact AC.

Referring to FIG. 5A, gate contacts GC may be provided to penetrate the second interlayer insulating layer 120 and the gate capping pattern GP and to be electrically connected to the gate electrodes GE, respectively. When viewed in a plan view, the gate contacts GC may be disposed to be overlapped with PMOSFET and NMOSFET regions, respectively. In an embodiment, the gate contact GC may be provided on the first active pattern AP1.

In an embodiment, a region, which is located on the active contact AC adjacent to the gate contact GC, may be filled with an upper insulating pattern UIP, as shown in FIG. 5A. Thus, the upper insulating pattern UIP may limit and/or prevent the gate contact GC from being in contact with the active contact AC adjacent thereto or may limit and/or prevent a short circuit from occurring between the gate and active contacts GC and AC.

The gate contact GC may include the conductive pattern FM and the barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may be extended in the second direction D2 and parallel to each other.

In detail, the first and second power lines M1_R1 and M1_R2 may be respectively provided on the third and fourth borders BD3 and BD4 of the single height cell SHC. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

FIGS. 9A to 22 are sectional views illustrating a method of fabricating a semiconductor device according to an embodiment of inventive concepts. FIGS. 9A, 10A, 11A, 12A, 15A, and 16A are sectional views taken along a line A-A' of FIG. 4. FIGS. 11B, 12B, 15B, and 16B are sectional views taken along a line B-B' of FIG. 4. FIGS. 11C, 12C, and 16C are sectional views taken along a line C-C' of FIG. 4. FIGS. 9B, 10B, 15C, and 16D are sectional views taken along a line D-D' of FIG. 4. FIG. 13 is an enlarged sectional view illustrating a portion 'M' of FIG. 12A. FIG. 14 is an enlarged sectional view illustrating a portion 'N' of FIG. 12B.

Figure 9A:
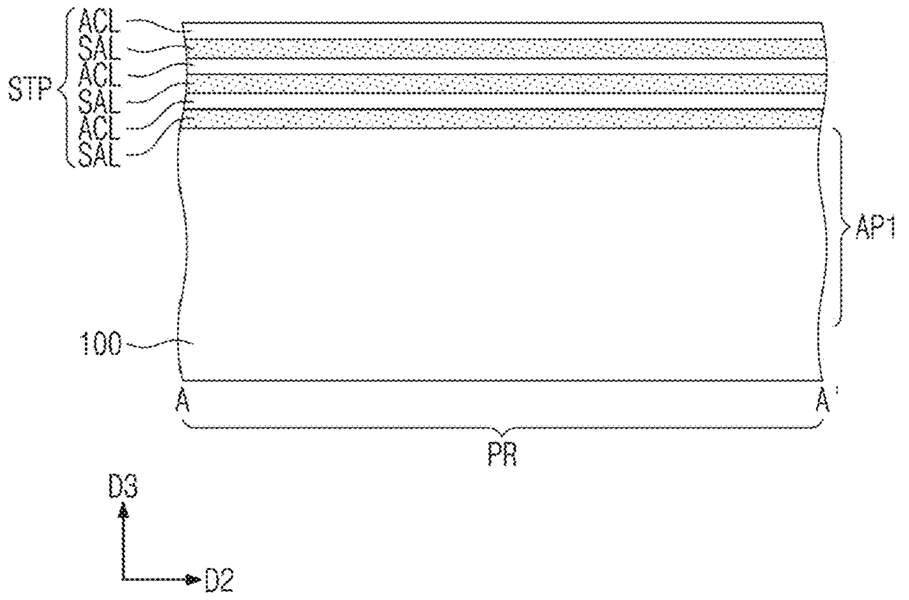
FIGS. 9 to 16D are sectional views illustrating a method of fabricating a semiconductor device according to an embodiment of inventive concepts.
Figure 9B:
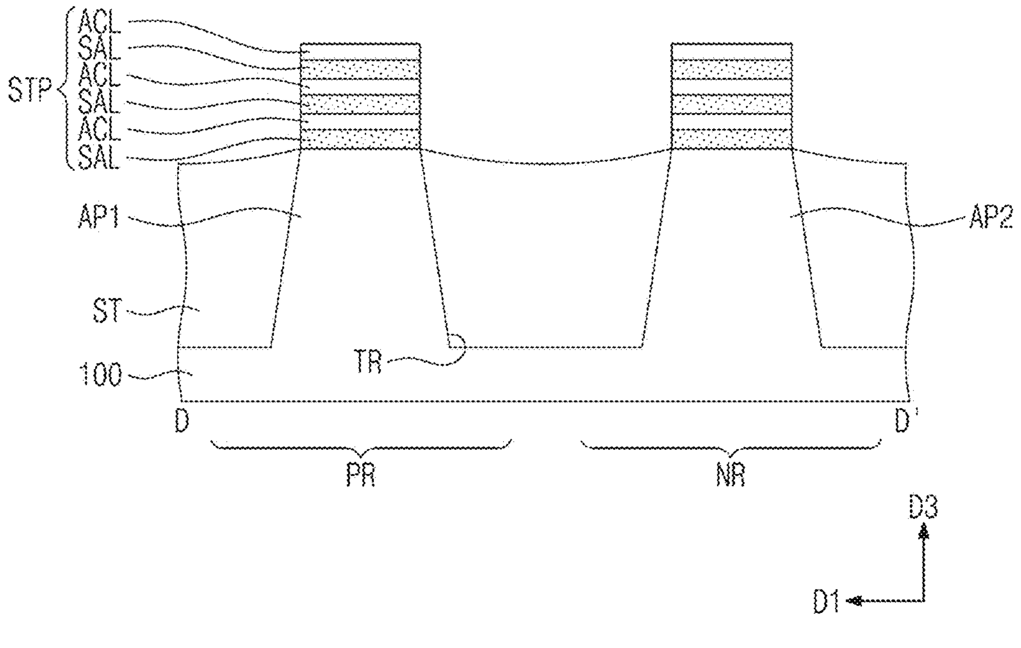

Referring to FIGS. 9A and 9B, the substrate 100 including a PMOSFET region PR and an NMOSFET region NR may be provided. Active layers ACL and sacrificial layers SAL may be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from 10 at % to 30 at %.

Mask patterns may be respectively formed on the PMOSFET and NMOSFET regions PR and NR of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first and second active patterns AP1 and AP2 may be formed on the PMOSFET and NMOSFET regions PR and NR, respectively.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed at a level higher than the device isolation layer ST and may be exposed to the outside of the device isolation layer ST. In other words, the stacking patterns STP may protrude vertically above the device isolation layer ST.

Figure 10A:
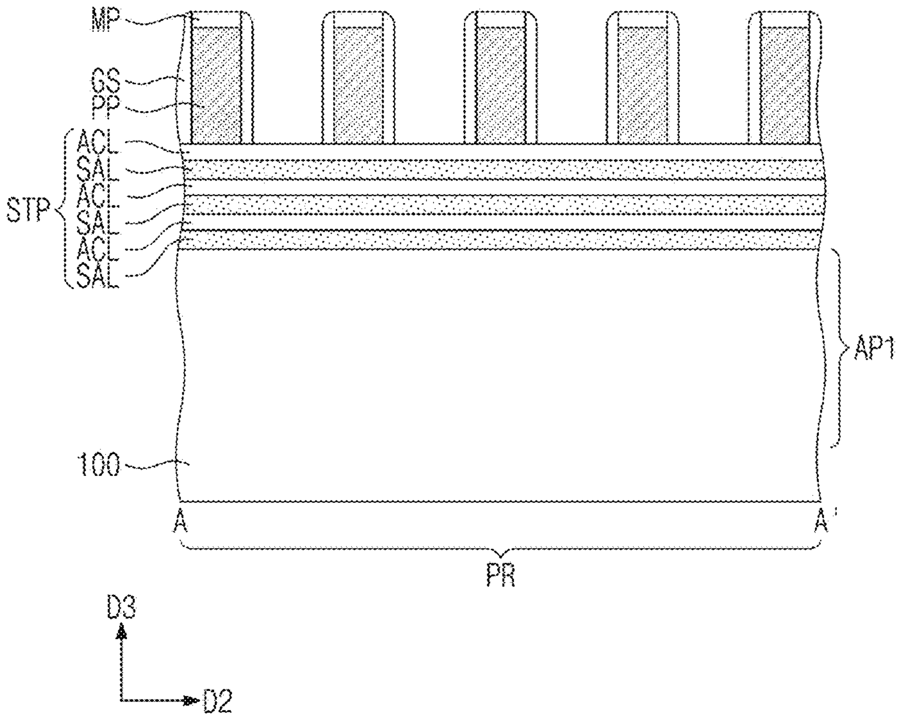
Figure 10B:
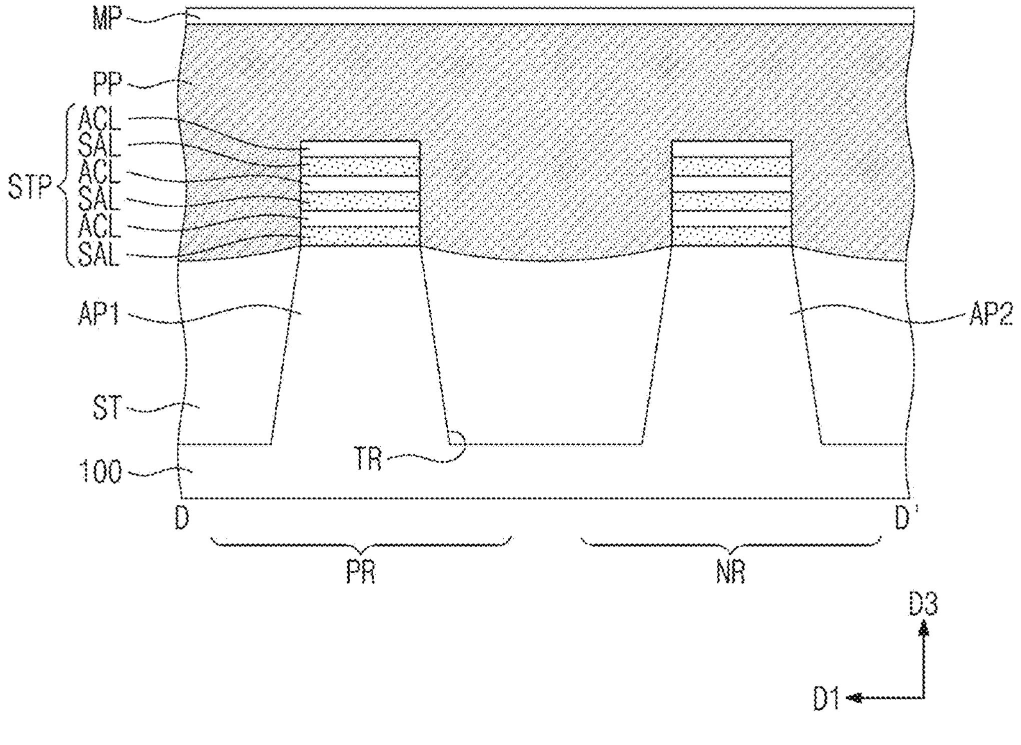

Referring to FIGS. 10A and 10B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. In an embodiment, the gate spacer layer may be a multi-layered structure including at least two of SiCN, SiCON, or SiN.

Figure 11A:
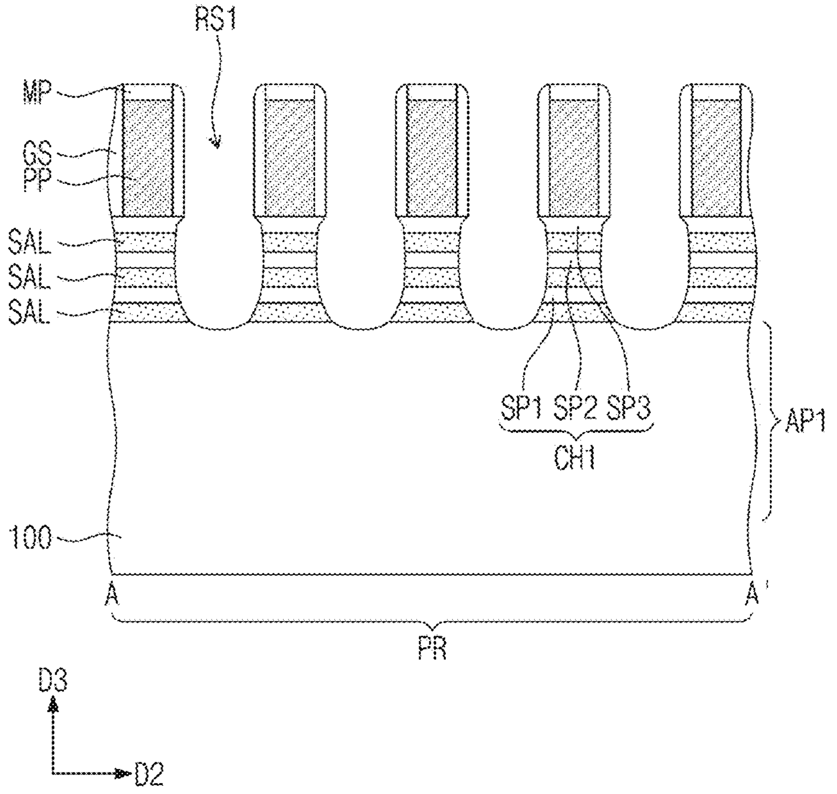
Figure 11B:
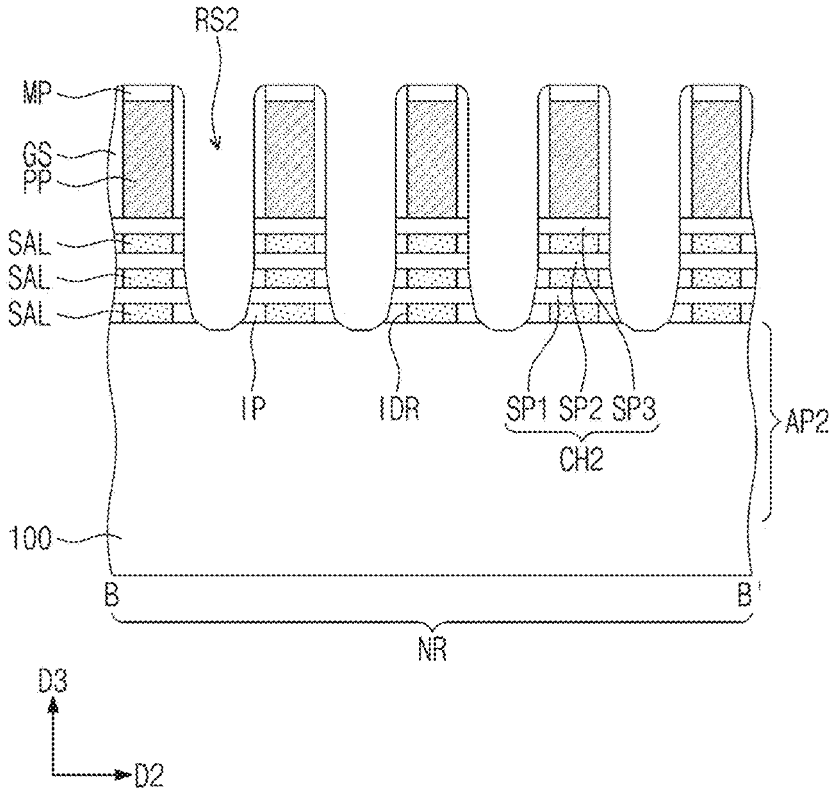
Figure 11C:
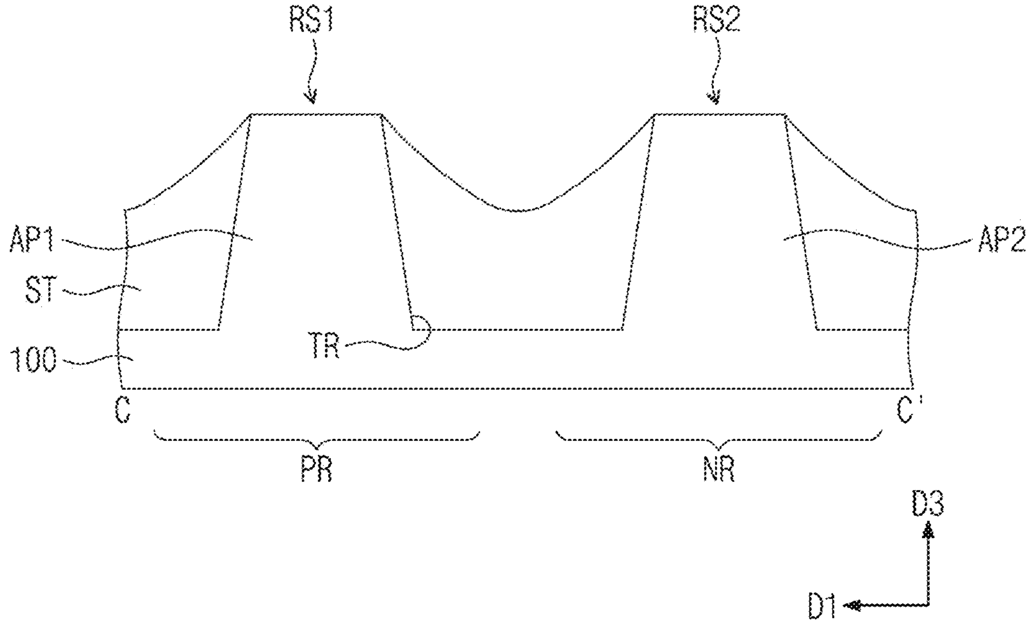

Referring to FIGS. 11A to 11C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 11C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The second recesses RS2 in the stacking pattern STP on the second active pattern AP2 may be formed by the same method as that for the first recesses RS1.

The first to third semiconductor patterns SP1, SP2, and SP3, which are sequentially stacked between adjacent ones of the first recesses RS1, may be formed from the active layers ACL. The first to third semiconductor patterns SP1, SP2, and SP3, which are sequentially stacked between adjacent ones of the second recesses RS2, may be formed from the active layers ACL. In this case, the first semiconductor pattern SP1 may be formed as the lowermost one of the semiconductor patterns, and the third semiconductor pattern SP3 may be formed as the uppermost one of the semiconductor patterns. The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Figure 12A:
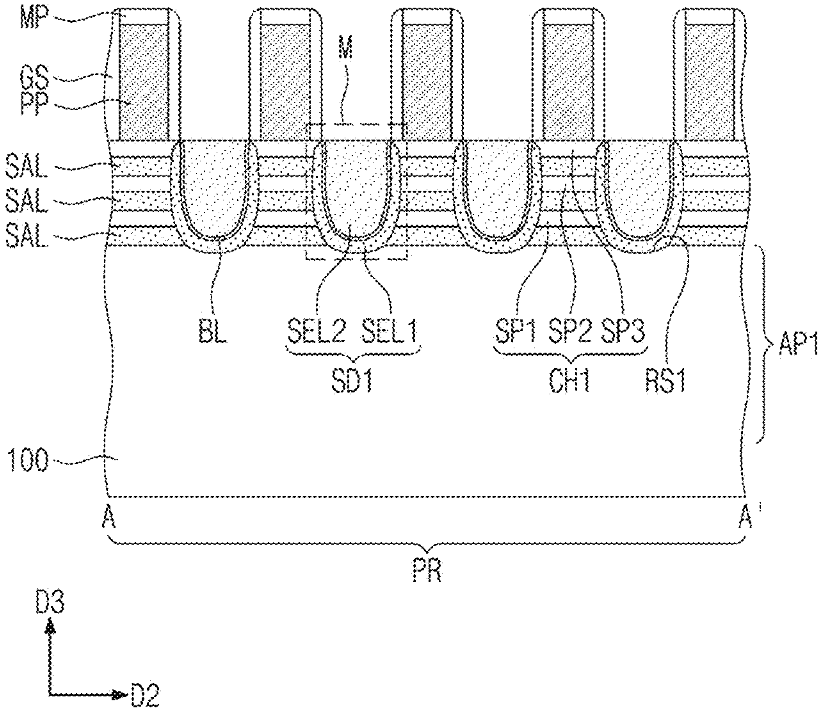
Figure 13:
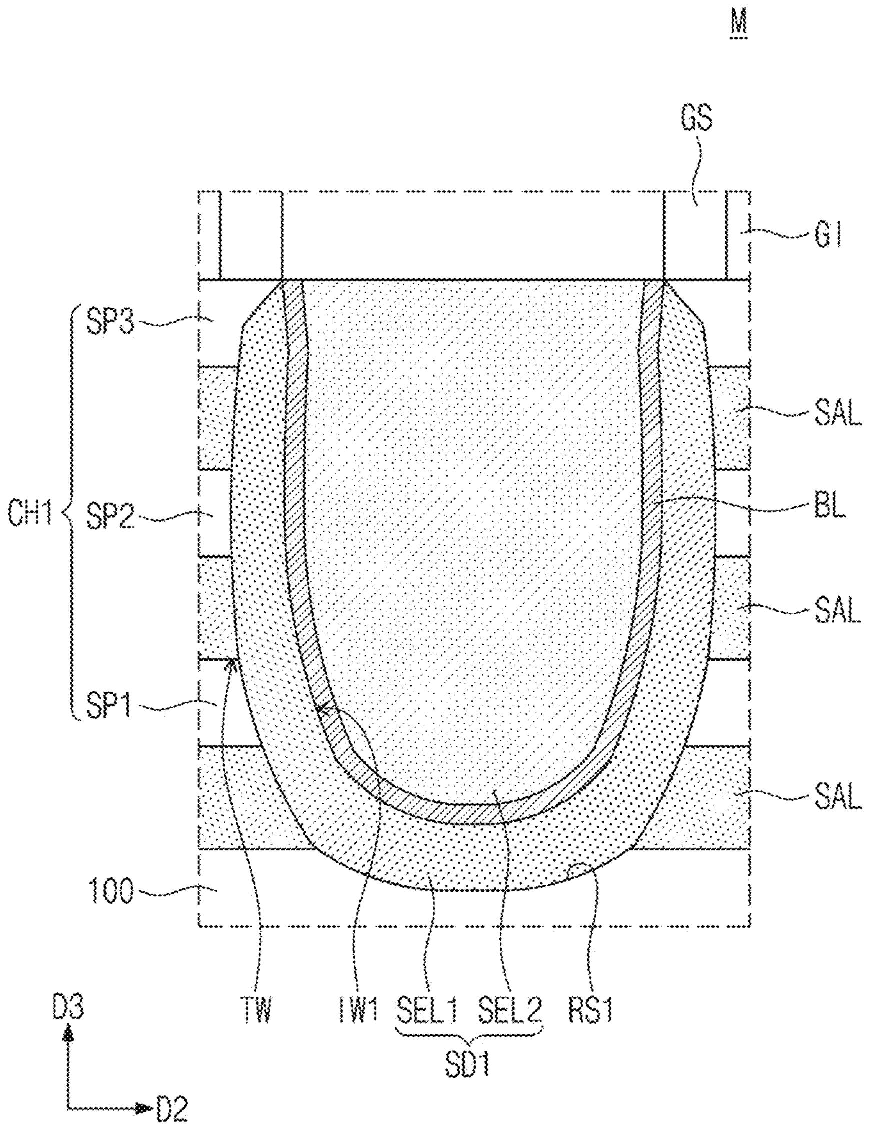
Figure 14:
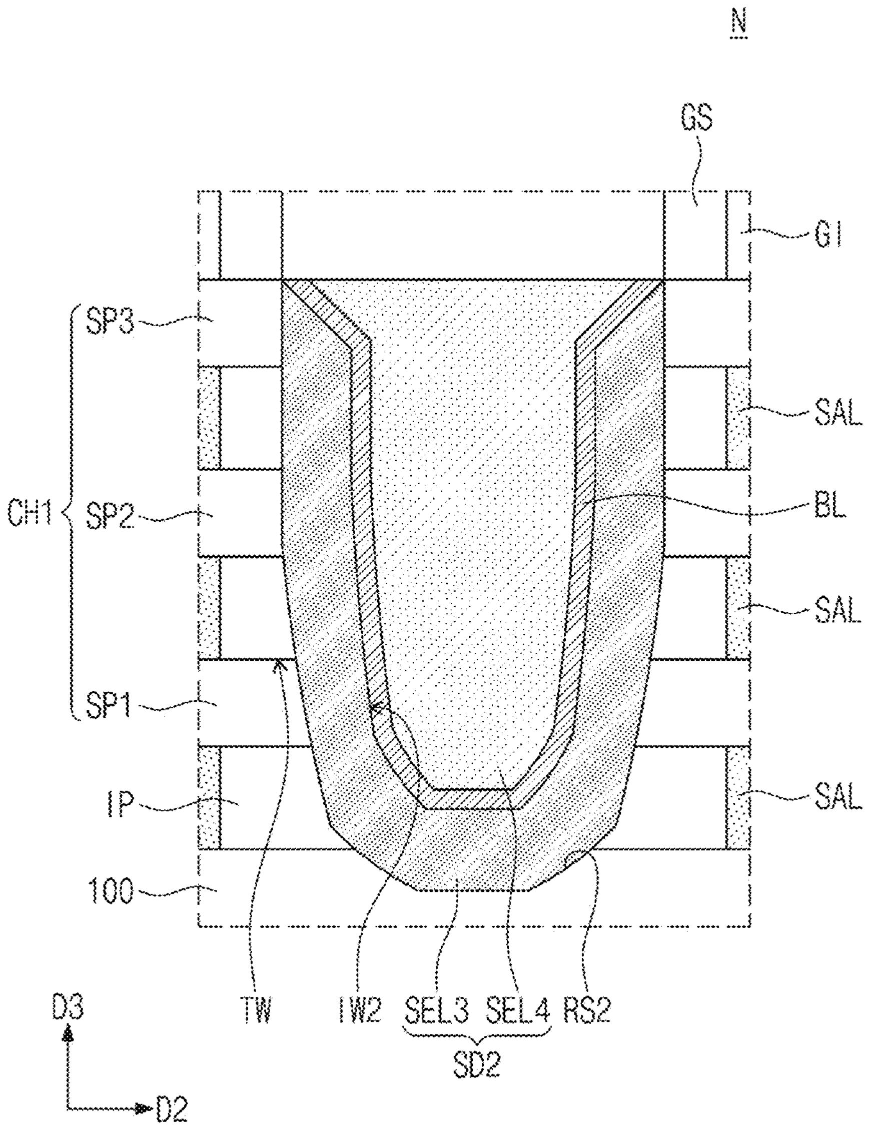

Referring to FIGS. 12A and 13, the first source/drain patterns SD1 may be formed in the first recesses RS1, respectively. The first source/drain pattern SD1 may include the first layer SEL1 and the second layer SEL2 on the first layer SEL1. A blocking layer BL may be formed between the first layer SEL1 and the second layer SEL2. The blocking layer BL may cover side and bottom surfaces of the second layer SEL2. The first layer SEL1 may cover side and bottom surfaces of the blocking layer BL. A mean thickness of the blocking layer BL may be smaller than a mean thickness of the first layer SEL1.

In detail, the first source/drain pattern SD1 may be formed by the following method. First, the first layer SEL1 may be formed by a selective epitaxial growth (SEG) process using an inner surface of the first recess RS1 as a seed layer. The first layer SEL1 may be grown using the first to third semiconductor patterns SP1, SP2, and SP3, the sacrificial layers SAL, and the substrate 100, which are exposed by the first recess RS1, as a seed layer. As an example, the first SEG process may include a chemical vapor deposition (CVD) process or a molecular beam epitaxy (MBE) process. The first layer SEL1 may be formed of or include at least one of silicon (Si) or silicon-germanium (SiGe).

A top surface of the first layer SEL1 may be recessed toward the substrate 100. As a result of the recessing step, the first layer SEL1 may have a first inner surface IW1. The bottommost surface of the first inner surface IW1 may be lower than the top surface TW of the first semiconductor pattern SP1. However, in an embodiment, the bottommost surface of the first inner surface IW1 may be located at a level that is equal to or higher than the top surface TW of the first semiconductor pattern SP1. The recess depth of the first layer SEL1 may be adjusted to control the vertical length LG1 of the active contact AC in a subsequent step. That is, the recess depth of the first layer SEL1 may be adjusted in consideration of a desired value of the vertical length LG1 of the active contact AC.

The blocking layer BL may be conformally formed on the first inner surface IW. The blocking layer BL may be formed of or include at least one of silicon (Si) or silicon-boron (SiB). The mean thickness of the blocking layer BL may range from 1 nm to 5 nm. Although not illustrated in the drawings, the blocking layer BL may be omitted. In this case, there may be a difference in germanium concentration between the first and second layers SEL1 and SEL2.

The second layer SEL2 may be formed on the blocking layer BL. The second layer SEL2 may be formed to completely fill the first recess RS1. A top surface of the second layer SEL2 may be located at a level that is equal to or higher than a bottom surface of the gate spacer GS. The second layer SEL2 may include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), or silicon-arsenic-carbon (SiAsC). A germanium concentration of the second layer SEL2 may be higher than that of the first layer SEL1. In an embodiment, the germanium concentration of the second layer SEL2 may range from 30 at % to 70 at %, and the germanium concentration of the first layer SEL1 may range from 0 at % to 30 at %. In an embodiment, the germanium concentration of the first layer SEL1 may be equal to or lower than the second layer SEL2.

Figure 12B:
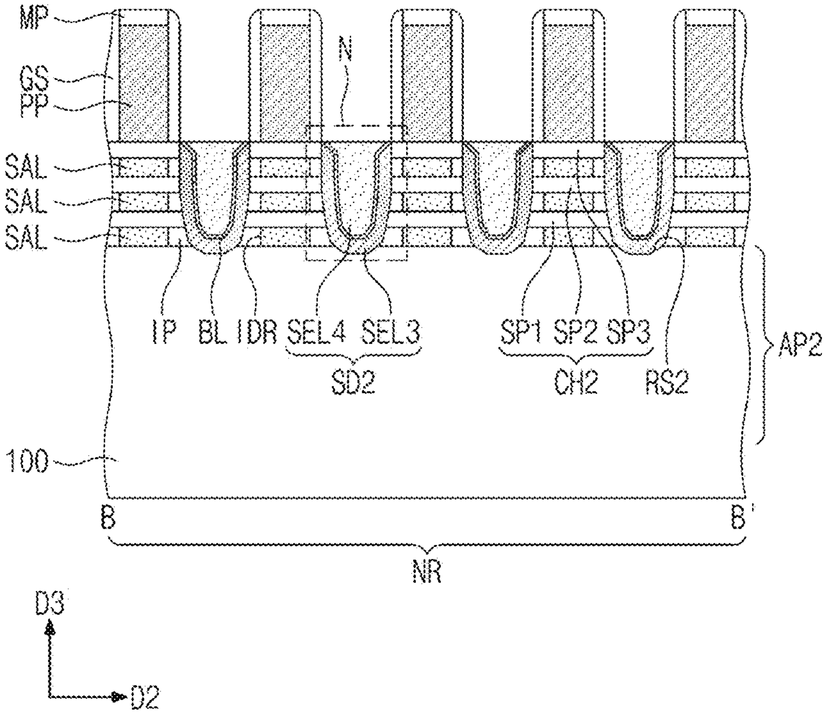
Figure 12C:
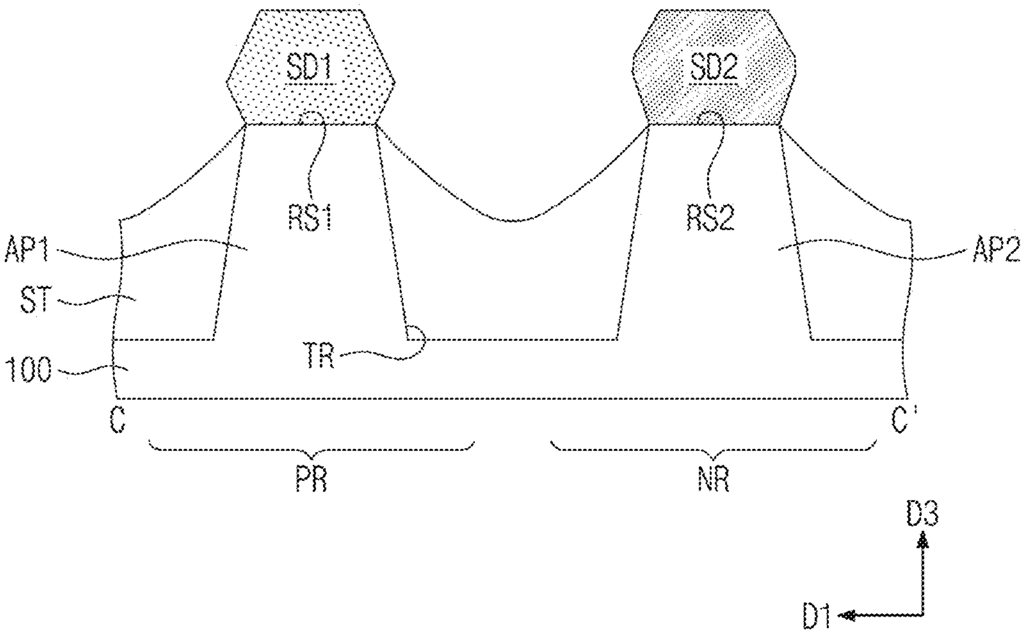

Referring to FIGS. 12B and 14, the second source/drain patterns SD2 may be formed in the second recesses RS2, respectively. The second source/drain pattern SD2 may include a third layer SEL3 and a fourth layer SEL4 on the third layer SEL3. The blocking layer BL may be formed between the third layer SEL3 and the fourth layer SEL4. The blocking layer BL may cover side and bottom surfaces of the fourth layer SEL4. The mean thickness of the blocking layer BL may be smaller than a mean thickness of the third layer SEL3. The inner spacers IP may be respectively formed between the second source/drain pattern SD2 and the sacrificial layers SAL.

In detail, the second source/drain pattern SD2 may be formed by the following method. The third layer SEL3 may be formed by a SEG process using an inner surface of the second recess RS2 as a seed layer. The third layer SEL3 may be formed by substantially the same method as that for the first layer SEL1. The third layer SEL3 may be formed of or include at least one of silicon-arsenic (SiAs), silicon-phosphorus (SiP), or silicon (Si).

A top surface of the third layer SEL3 may be recessed toward the substrate 100. As a result of the recessing step, the third layer SEL3 may have a second inner surface IW2. The blocking layer BL may be conformally formed on the second inner surface IW2. The blocking layer BL may be formed of or include at least one of silicon-arsenic (SiAs), silicon-phosphorus (SiP), or silicon (Si). The mean thickness of the blocking layer BL may range from 1 nm to 5 nm.

The fourth layer SEL4 may be formed on the blocking layer BL. The fourth layer SEL4 may be formed to completely fill the second recess RS2. A top surface of the fourth layer SEL4 may be located at a level that is equal to or higher than the bottom surface of the gate spacer GS. The fourth layer SEL4 may include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), or silicon-arsenic-carbon (SiAsC). As an example, the germanium concentration of the fourth layer SEL4 may range from 1 at % to 70 at %.

Figure 15A:
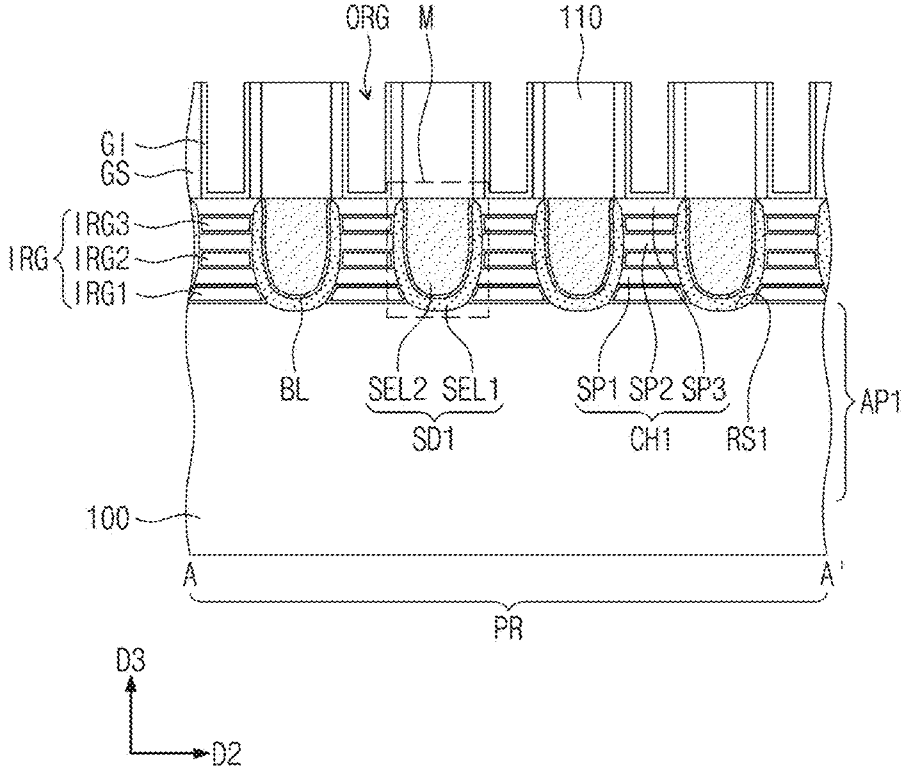
Figure 15B:
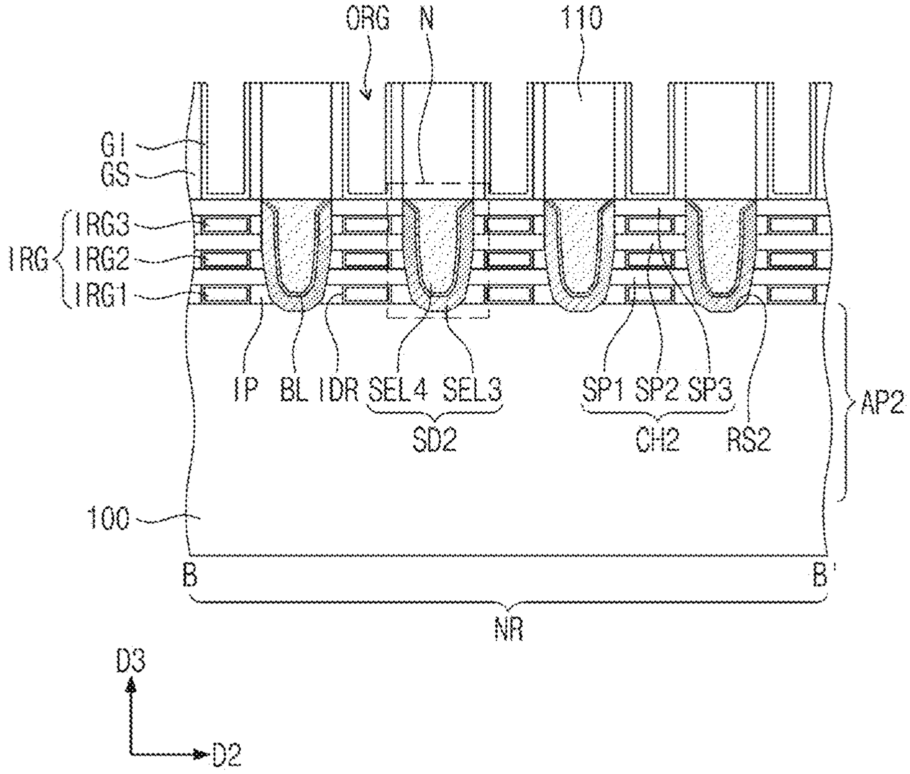
Figure 15C:
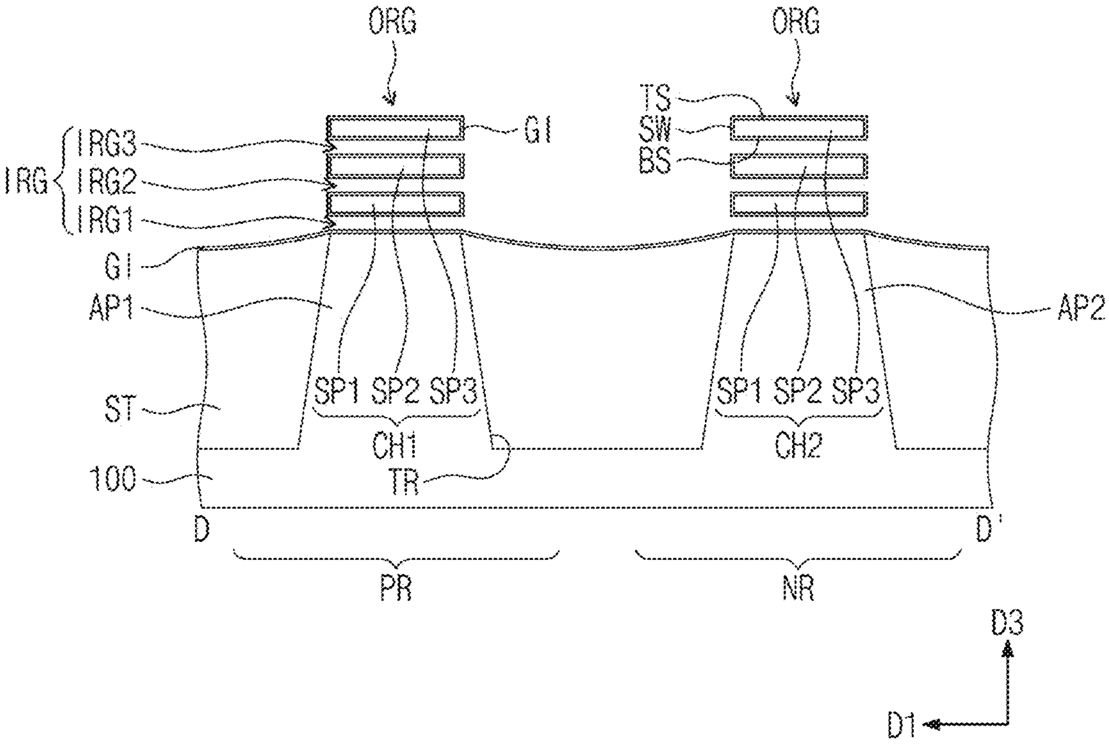
Figure 16A:
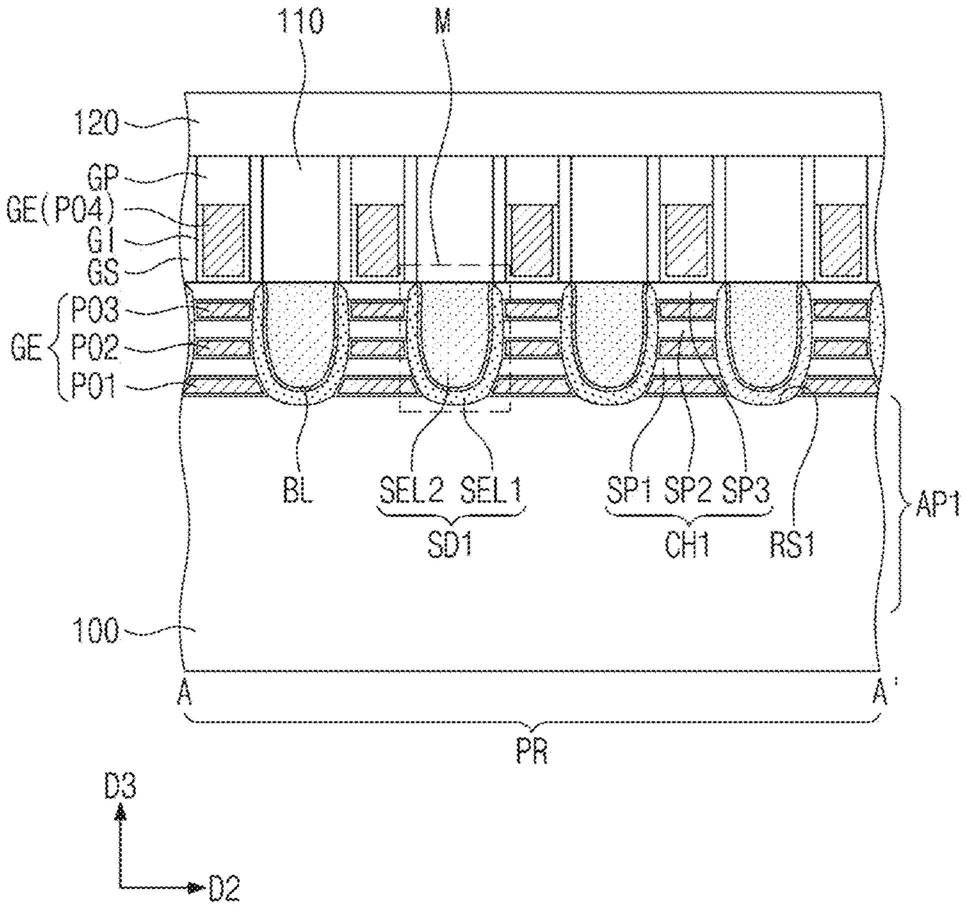
Figure 16B:
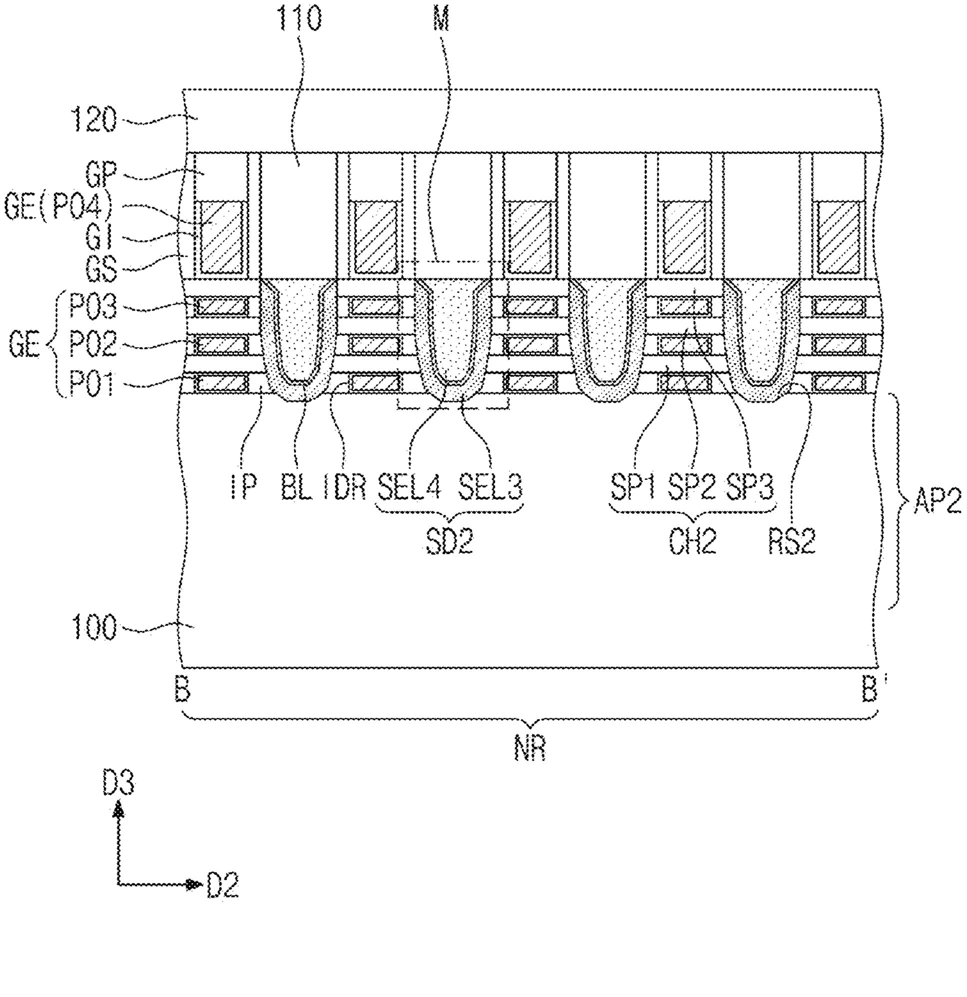
Figure 16C:
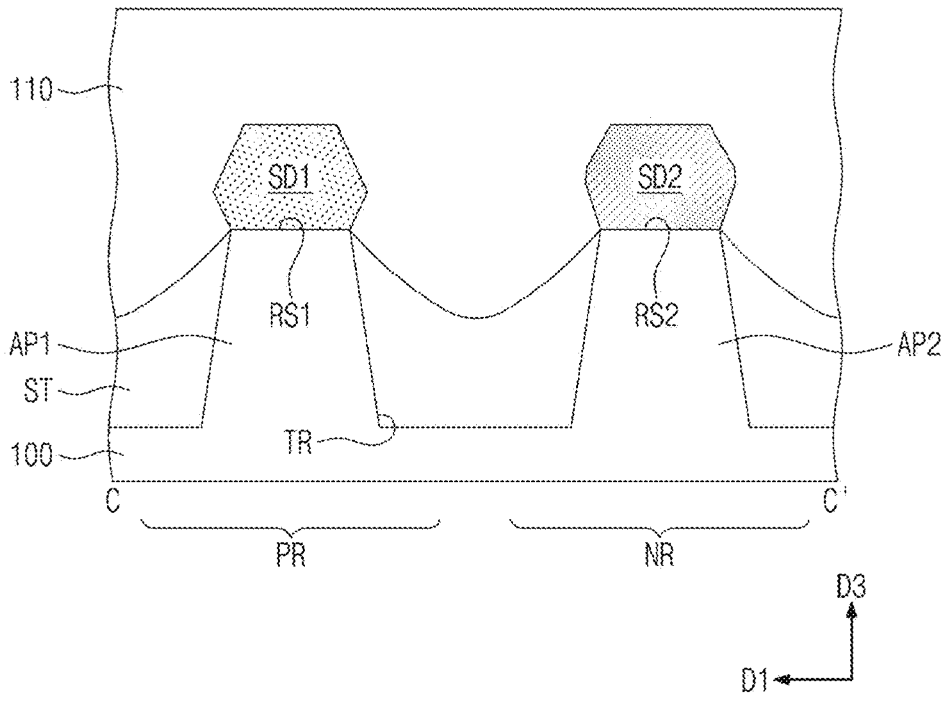
Figure 16D:
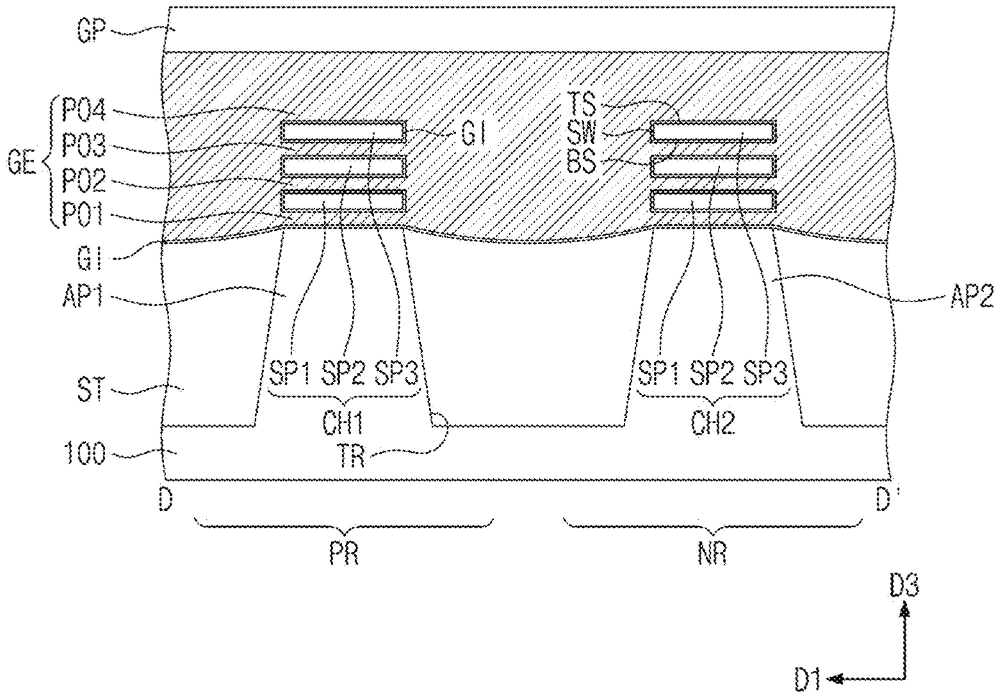

Referring to FIGS. 15A to 15C, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 15C). The removal of the sacrificial patterns PP may include a wet etching process which is performed using an etching solution capable of selectively etching polysilicon.

The sacrificial layers SAL exposed through the outer region ORG may be selectively removed to form inner regions IRG (e.g., see FIG. 15C). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

During the etching process, the sacrificial layers SAL on the PMOSFET and NMOSFET regions PR and NR may be removed. The etching process may be a wet etching process. An etchant material, which is used in the etching process, may be chosen to quickly remove the sacrificial layer SAL having a relatively high germanium concentration.

Referring to FIG. 15C, as a result of the selective removal of the sacrificial layers SAL, only the stacked first to third semiconductor patterns SP1, SP2, and SP3 may be left on each of the first and second active patterns AP1 and AP2. Hereinafter, empty regions, which are formed by removing the sacrificial layers SAL, will be referred to as first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 15A to 15C, the gate insulating layer GI may be formed on the exposed first to third semiconductor patterns SP1, SP2, and SP3. The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

Referring to FIGS. 16A to 16D, the gate electrode GE may be formed on the gate insulating layer GI. The gate electrode GE may be formed to fill the first to third inner regions IRG1, IRG2, and IRG3 and the outer region ORG. The gate electrode GE may include the first, second, and third portions PO1, PO2, and PO3 filling the first to third inner regions IRG1, IRG2, and IRG3, respectively. The gate electrode GE may include the fourth portion PO4 filling the outer region ORG. The gate capping pattern GP may be formed on the gate electrode GE.

Referring to FIGS. 5A to 5D and 16A to 16B, the second interlayer insulating layer 120 may be formed on the first interlayer insulating layer 110. The second interlayer insulating layer 120 may include a silicon oxide layer.

Figure 17:
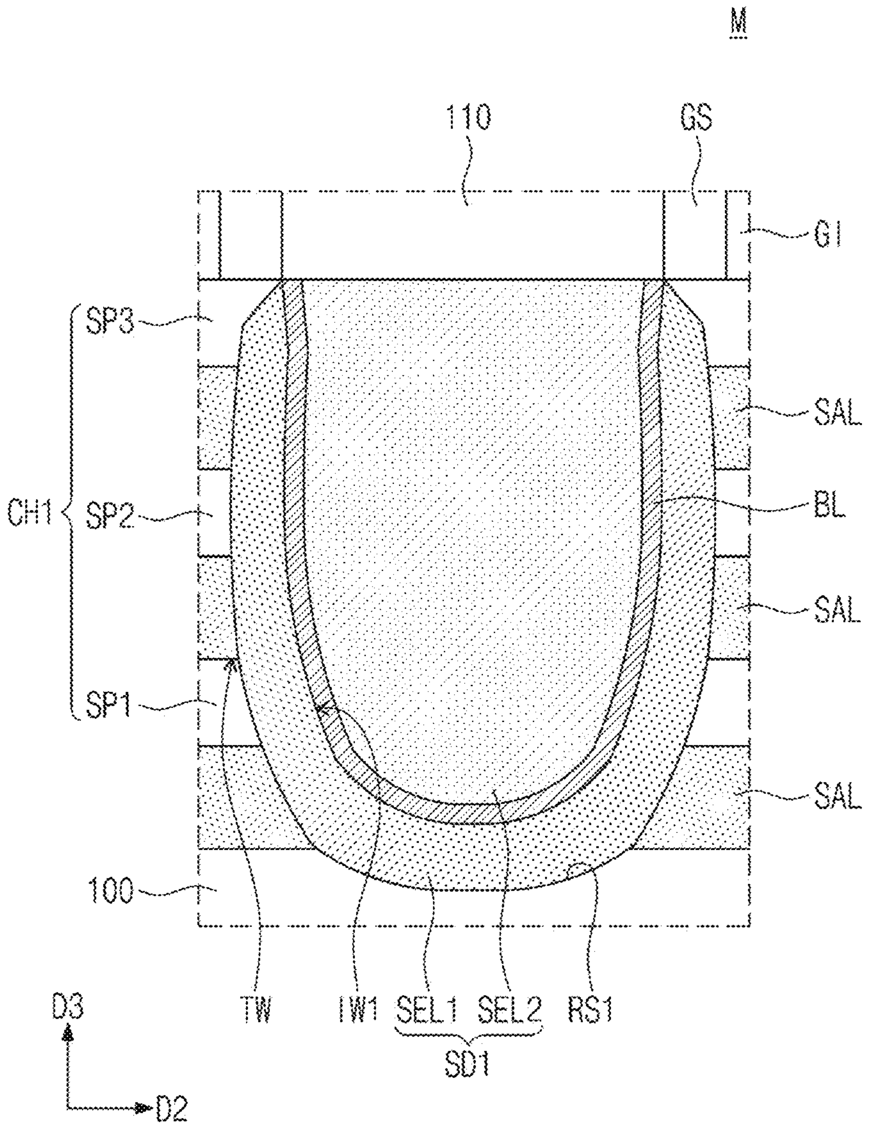
FIGS. 17 to 19 are sectional views illustrating a method of forming the portion 'M' of FIG. 5A.
Figure 18:
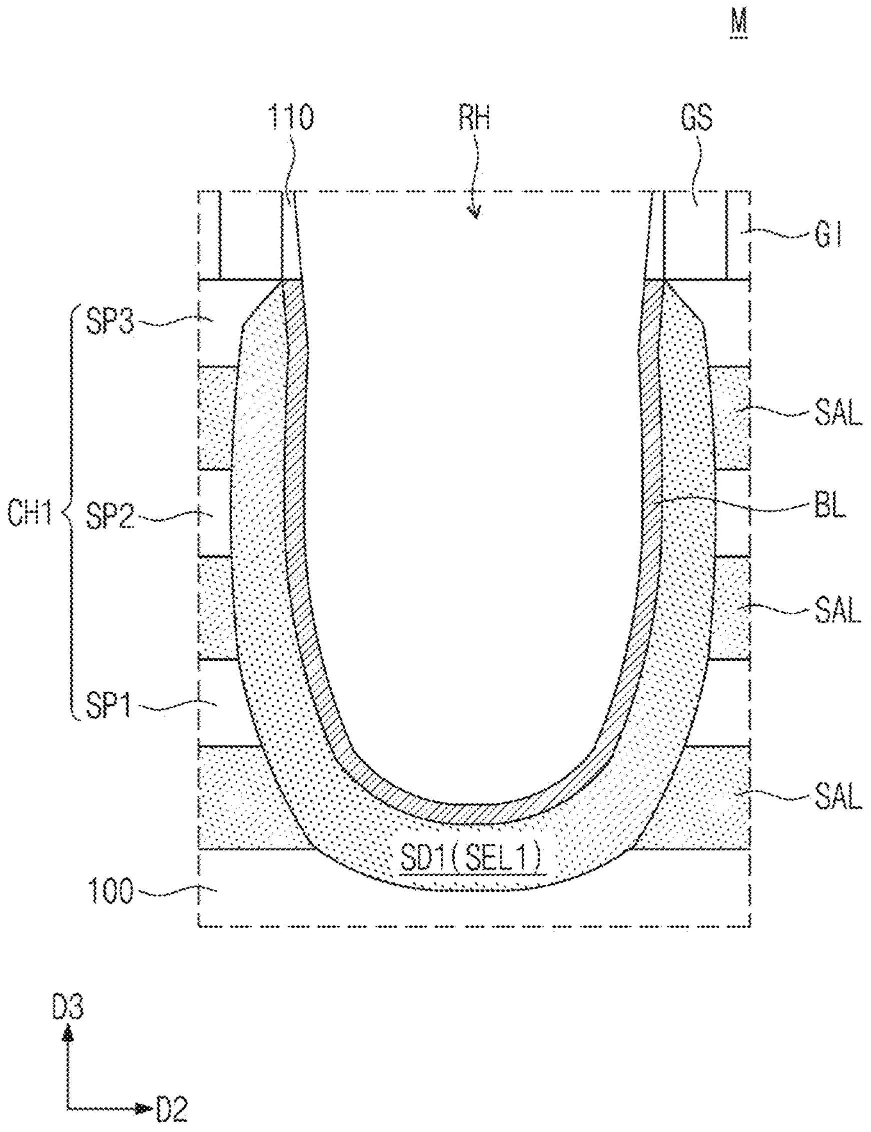
Figure 19:
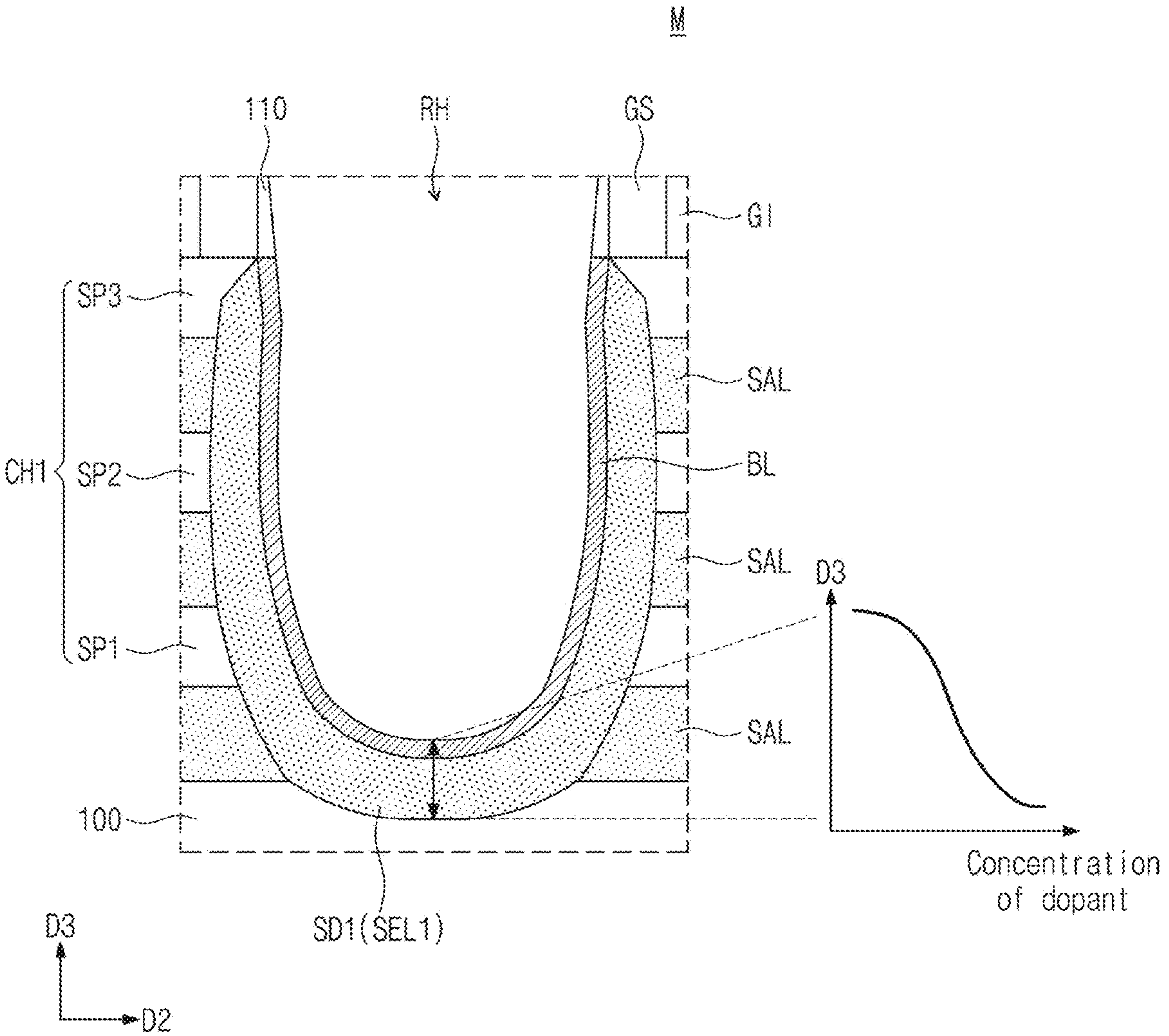
Figure 20:
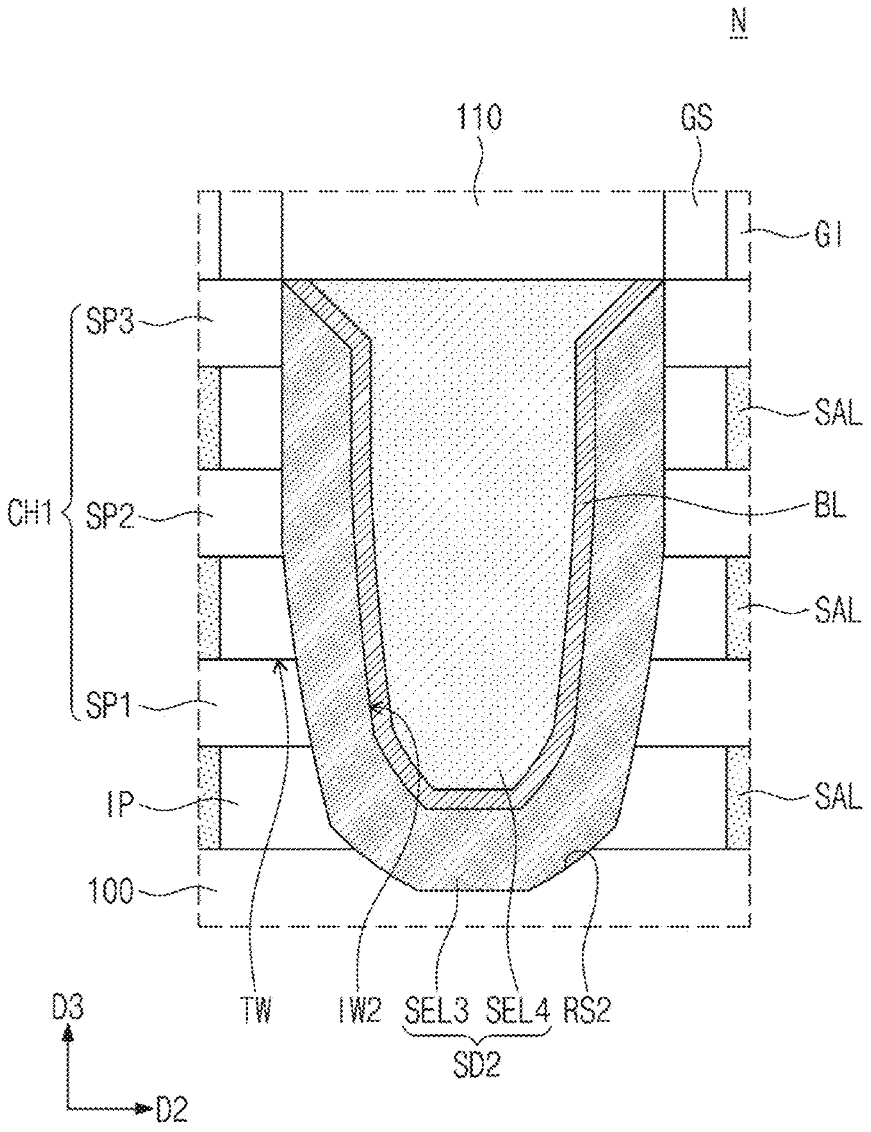
FIGS. 20 to 22 are sectional views illustrating a method of forming the portion 'N' of FIG. 5B.
Figure 21:
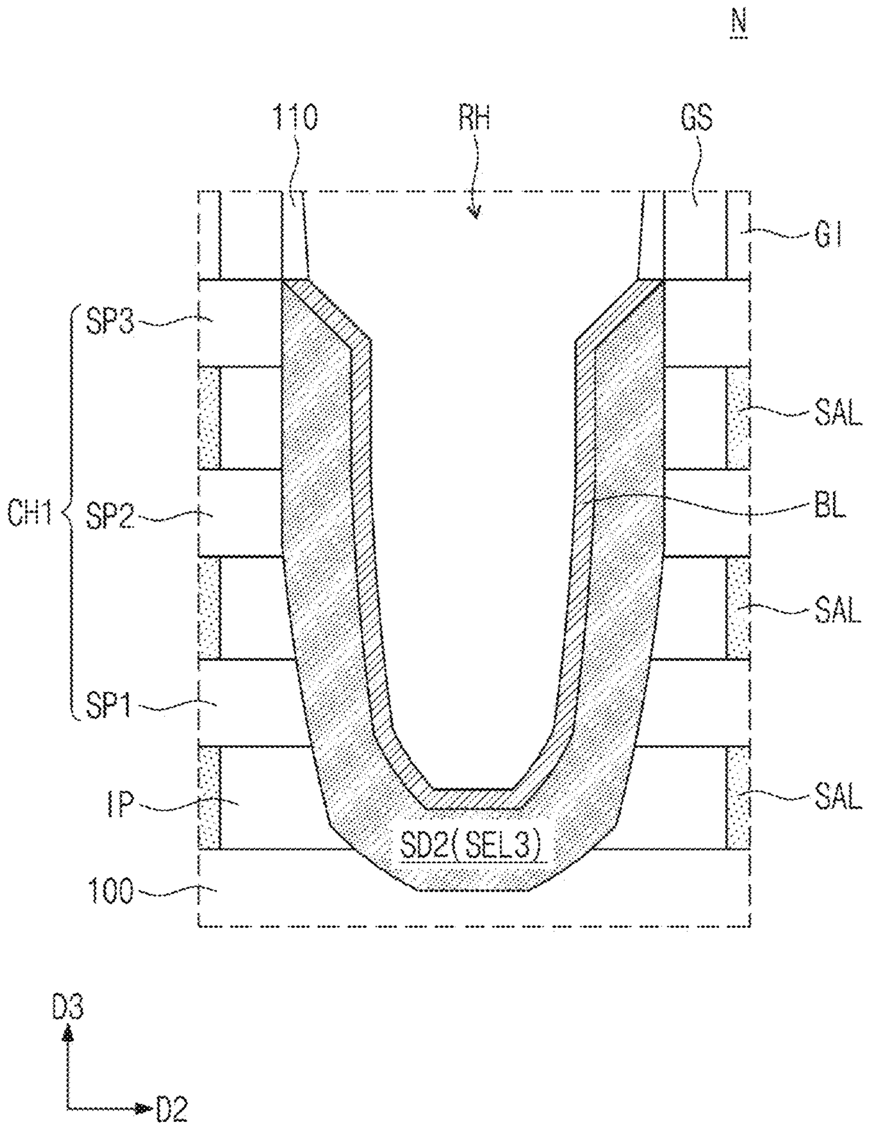
Figure 22:
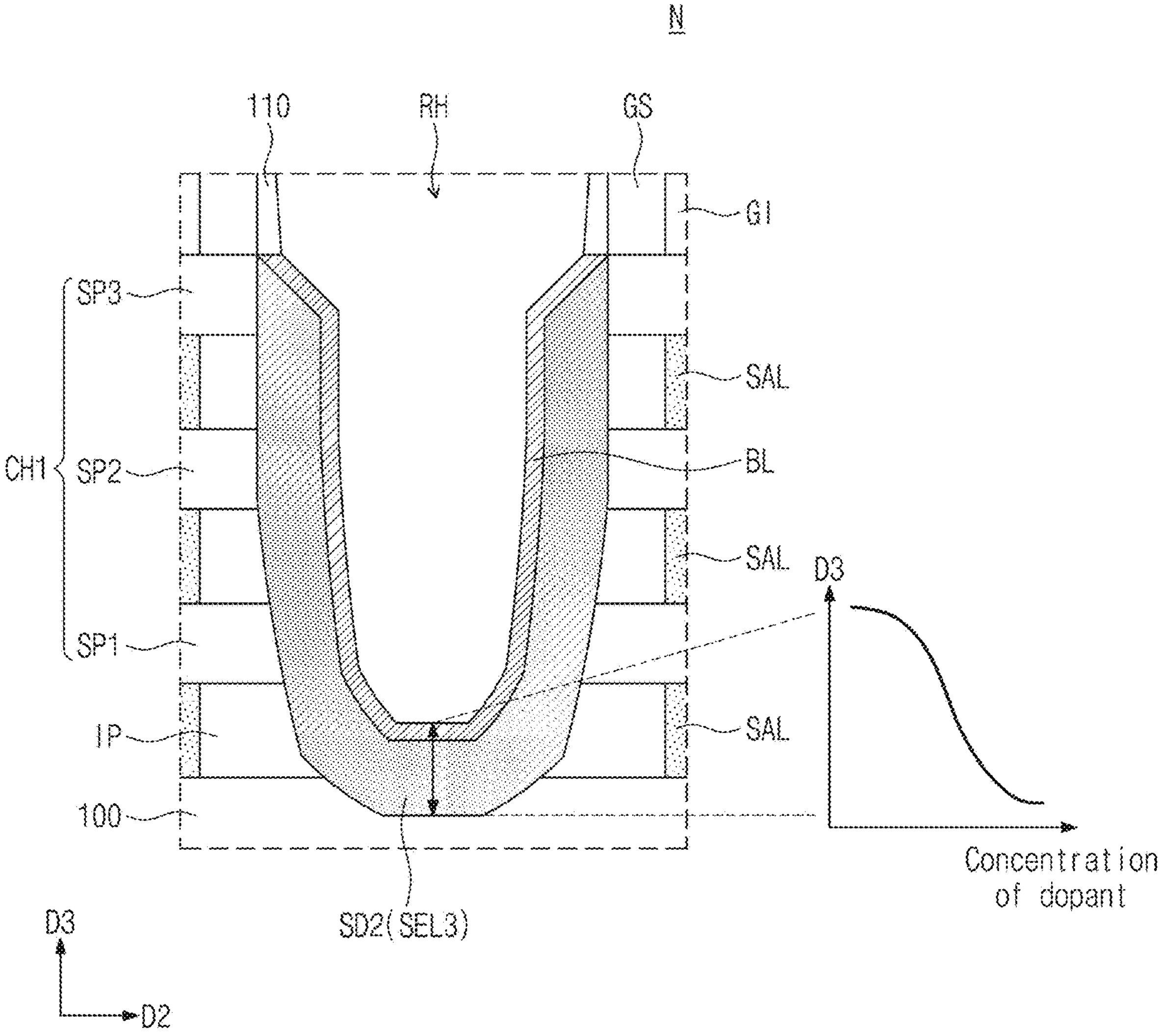

A method of forming the active contact AC will be described in more detail with reference to FIGS. 17 to 27. FIGS. 17 to 19 are enlarged sectional views illustrating a method of forming the portion 'M' of FIG. 5A. FIGS. 20 to 22 are enlarged sectional views illustrating a method of forming the portion 'N' of FIG. 5B. A method of forming the active contact AC on the PMOSFET and NMOSFET regions PR and NR will be described in more detail with reference to FIGS. 17 to 22.

Referring to FIGS. 18 and 21, the second layer SEL2 and the fourth layer SEL4 may be selectively removed by a first etching process. The second layer SEL2 and the fourth layer SEL4 may be formed of or include a material having an etch selectivity with respect to the blocking layer BL. For example, the second layer SEL2 may be formed of or include silicon germanium (SiGe), and the blocking layer BL may be formed of or include silicon (Si). A portion of the first interlayer insulating layer 110 may be removed by the first etching process. The second layer SEL2, the fourth layer SEL4, and a portion of the first interlayer insulating layer 110 may be removed to form a recess hole RH exposing the blocking layer BL and the first interlayer insulating layer 110. The bottommost surface of the recess hole RH may be lower than the top surface TW of the first semiconductor pattern SP1.

The first etching process may be a wet etching process or a dry etching process. The dry etching process may be performed using a process gas containing at least one of fluorine ($F_2$), chlorine ($Cl_2$), or hydrogen chloride (HCl), and the wet etching process may be performed using solution containing at least one of hydrogen peroxide ($H_2O_2$), acetic acid ($CH_3COOH$), or hydrogen fluoride (HF).

Although not illustrated in the drawings, the blocking layer BL may be omitted. Here, the first layer SEL1 may have an etch selectivity with respect to the second layer SEL2, and the third layer SEL3 may have an etch selectivity with respect to the fourth layer SEL4. As an example, the first layer SEL1 may include a low concentration of silicon germanium (SiGe), and the second layer SEL2 may include a high concentration of silicon germanium (SiGe). A germanium concentration of the first layer SEL1 may range from 0 at % to 30 at %, and a germanium concentration of the second layer SEL2 may range from 30 at % to 70 at %. The difference of the germanium concentration may allow for selective removal of the second layer SEL2. In an embodiment, the third layer SEL3 may include silicon-phosphorus (SiP), and the fourth layer SEL4 may include silicon-germanium (SiGe).

Referring to FIGS. 19 and 22, impurities may be injected into the blocking layer BL and the source/drain pattern SD1 or SD2. The impurities may be injected into the blocking layer BL by a plasma doping (PLAD) method. More specifically, impurity ions, which are in a plasma state, may be injected into the blocking layer BL and the source/drain pattern SD1 or SD2. In the case where the blocking layer BL is omitted, the impurities may be directly injected into an inner surface of the source/drain pattern SD1 or SD2. The impurities in the first source/drain pattern SD1 may include at least one of boron (B), gallium (Ga), or indium (In). The impurities in the second source/drain pattern SD2 may include at least one of arsenic (As), phosphorus (P), or antimony (Sb). In an embodiment, impurities may be injected into the blocking layer BL through a pre-amorphization implantation (PAI) process. Here, the impurities may include at least one of argon (Ar) and germanium (Ge).

A concentration of the impurities may be higher in the blocking layer BL than in the source/drain pattern SD1 or SD2. The smaller the distance to the blocking layer BL, the higher the impurity concentration of the source/drain pattern SD1 or SD2. As a result of the injection of the impurities, a contact resistance between the active contact AC and the source/drain pattern SD1 or SD2 may be lowered.

Referring to FIGS. 6A, 7, 19, and 22, the active contacts AC may be formed to penetrate the second interlayer insulating layer 120 and the first interlayer insulating layer 110 and to be electrically connected to the first and second source/drain patterns SD1 and SD2. The intermediate layer SC may be formed between the active contact AC and the first and second source/drain patterns SD1 and SD2.

More specifically, the intermediate layer SC may be formed by depositing a metallic material on the blocking layer BL exposed by the recess hole RH. The metallic material may include at least one of titanium, tantalum, tungsten, nickel, or cobalt. The deposition of the metallic material may include a chemical vapor deposition (CVD) process.

The active contact AC may be formed on the intermediate layer SC. The formation of the active contact AC may include forming the barrier pattern BM and forming the conductive pattern FM on the barrier pattern BM. The barrier pattern BM may be conformally formed and may include a metal layer and/or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN). The conductive pattern FM may be formed of or include a low resistance metal. For example, the conductive pattern FM may be formed of or include at least one metal of aluminum, copper, tungsten, molybdenum, or cobalt.

The gate contact GC may be formed to penetrate the second interlayer insulating layer 120 and the gate capping pattern GP and to be electrically connected to the gate electrode GE. The gate contact GC may be formed by the same or similar method as that for the active contact AC.

The division structures DB may be respectively formed on the first and second borders BD1 and BD2 of the single height cell SHC. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 23:
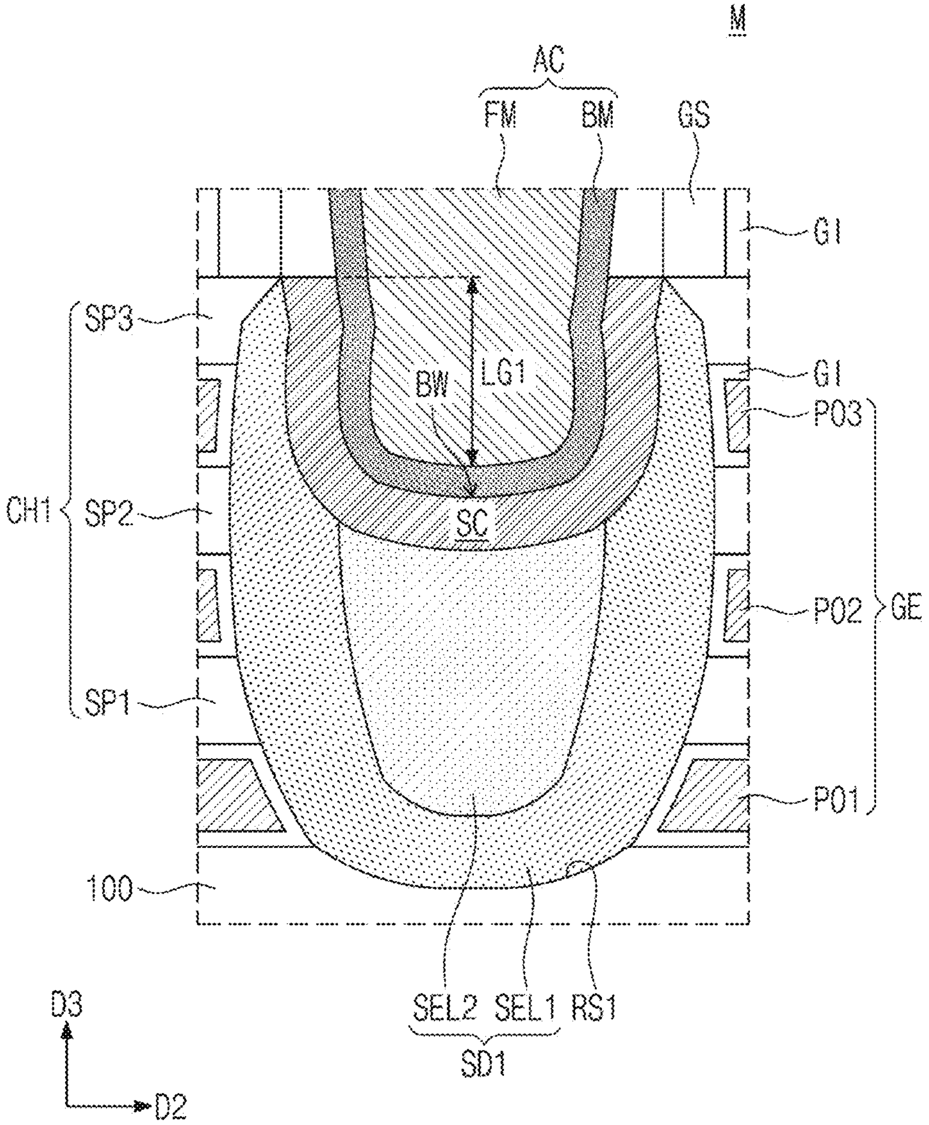
FIGS. 23 to 25 are sectional views illustrating another method of forming the portion 'M' of FIG. 5A.
Figure 24:
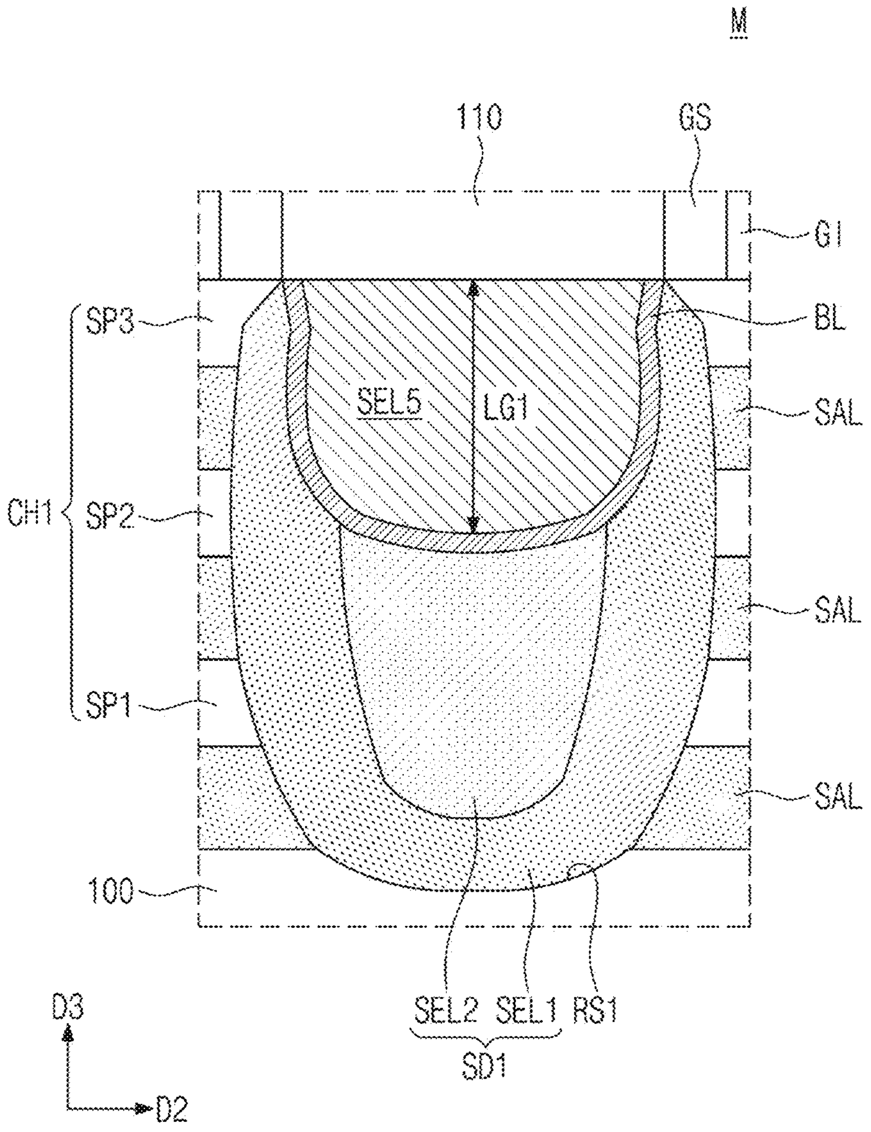
Figure 25:
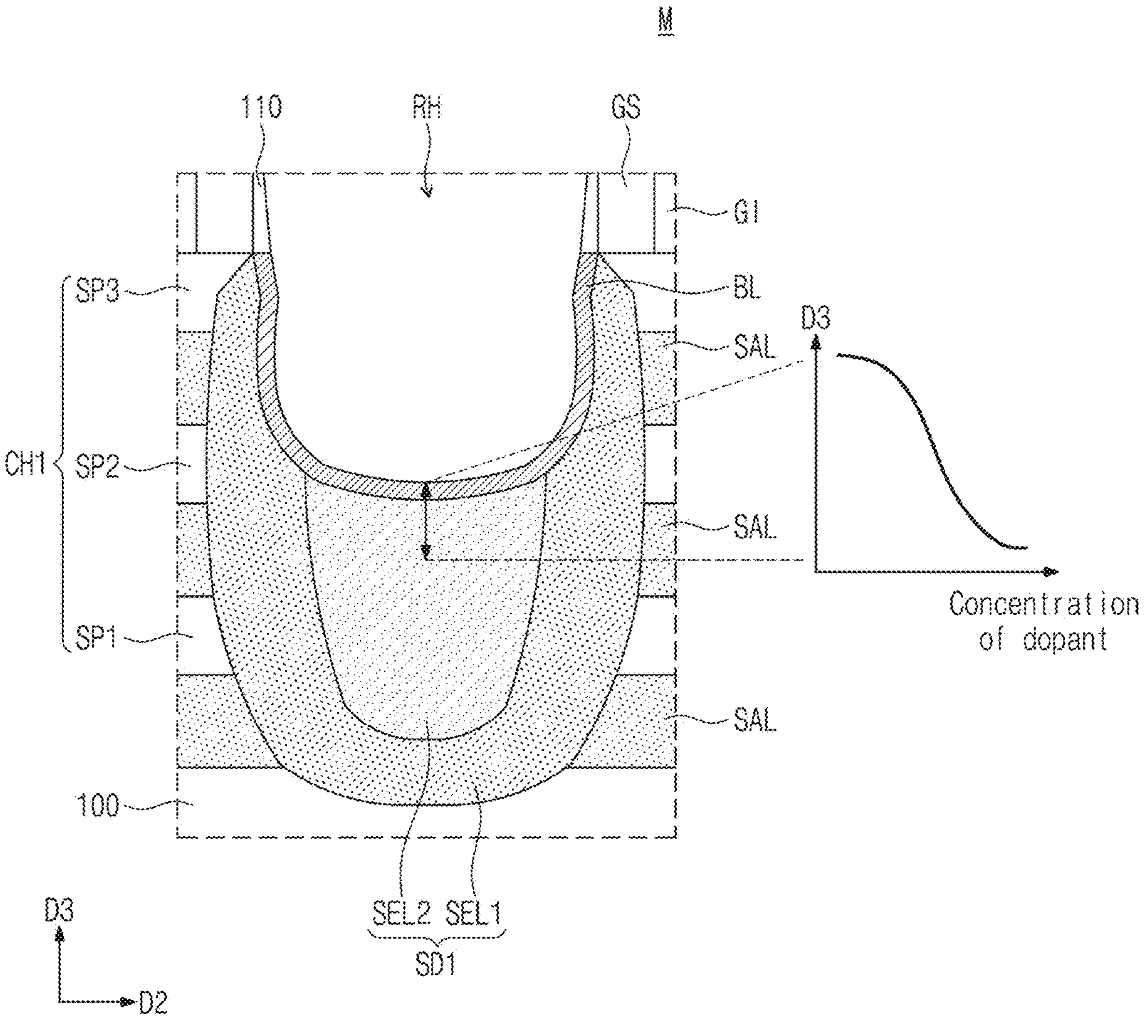
Figure 26:
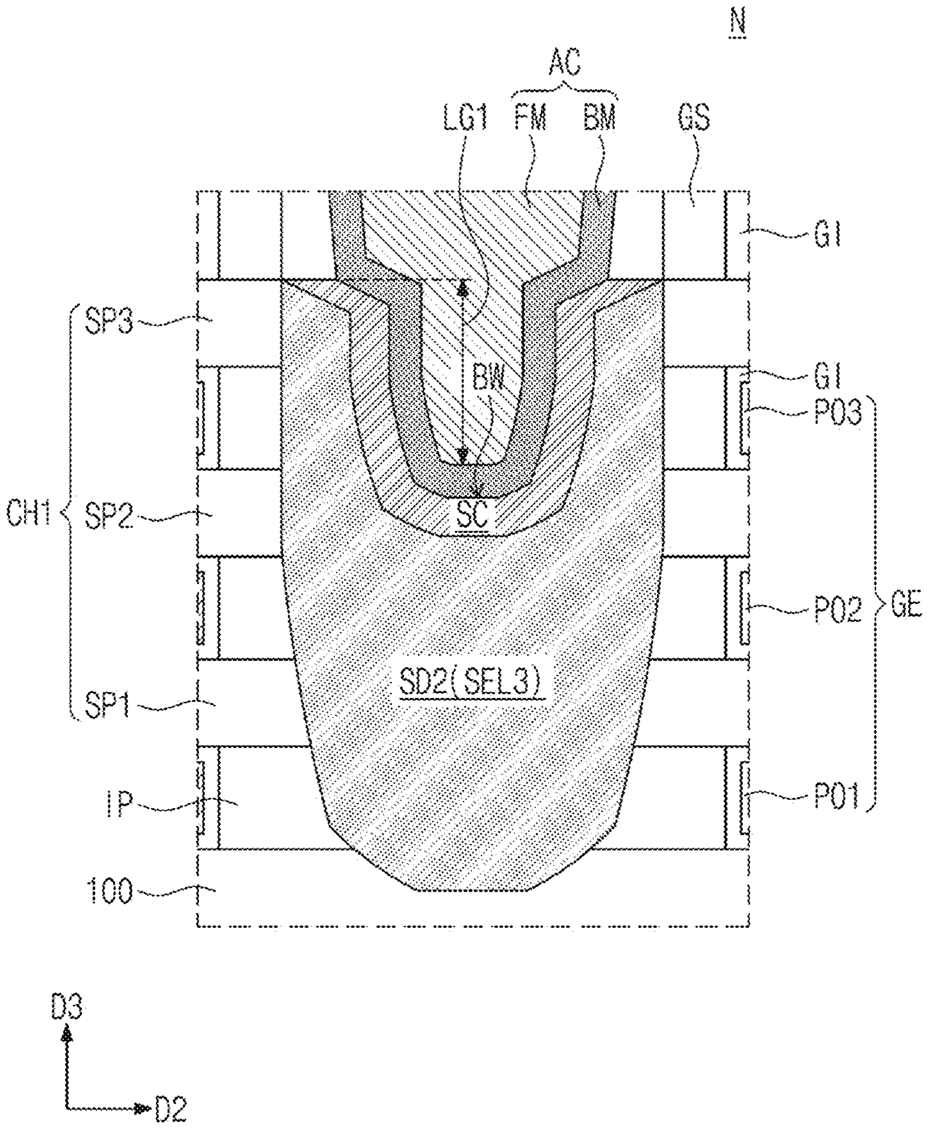
FIGS. 26 and 27 are sectional views illustrating another method of forming the portion 'N' of FIG. 5B.
Figure 27:
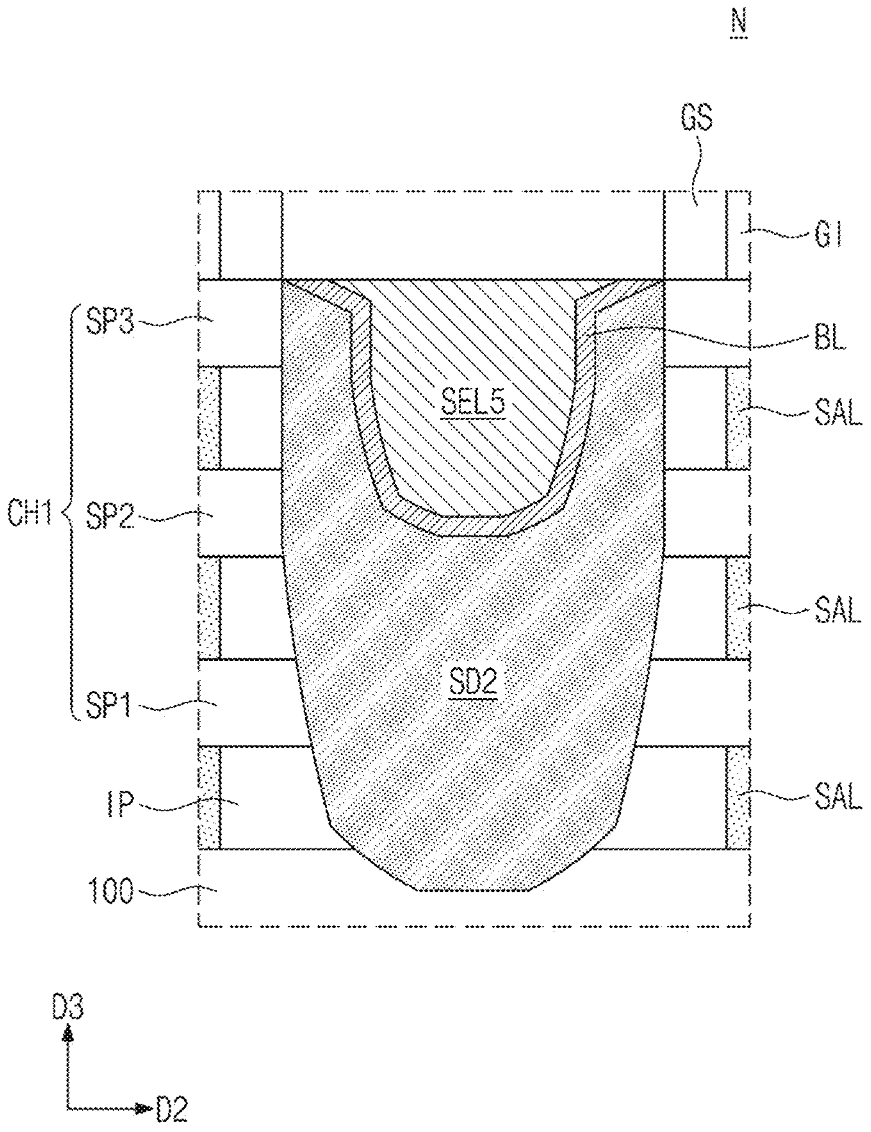

FIGS. 23 to 25 are sectional views illustrating another method of forming the portion 'M' of FIG. 5A. FIGS. 26 and 27 are sectional views illustrating another method of forming the portion 'N' of FIG. 5B. In the following description, an element previously described with reference to FIGS. 6A to 7 may be identified by the same reference number without repeating an overlapping description thereof, for concise description.

Referring to FIGS. 23 and 26, the bottommost surface BW of the active contact AC may be lower than a top surface of the second semiconductor pattern SP2. The second semiconductor pattern SP2 may be stacked on the first semiconductor pattern SP1. For this, the first layer SEL1 and the second layer SEL2 may be sequentially formed in the first recess RS1, and then, upper portions of the first and second layers SEL1 and SEL2 may be recessed. The third layer SEL3 may be formed in the second recess RS2, and an upper portion of the third layer SEL3 may be recessed. The recess depth of the first to third layers SEL1 to SEL3 may be adjusted in consideration of a desired value of the vertical length LG1 of the active contact AC. The blocking layer BL may be conformally formed on the recessed regions of the first to third layer SEL1 to SEL3.

A fifth layer SEL5 may be formed on the blocking layer BL. The fifth layer SEL5 may be formed of or include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), and silicon-arsenic-carbon (SiAsC). The fifth layer SEL5 may be selectively removed by an etching process. After the removal process, impurities may be injected into the blocking layer BL and the source/drain patterns SD1 and SD2. The intermediate layer SC on the blocking layer BL and the active contact AC on the intermediate layer SC may be sequentially formed.

In the embodiment of FIGS. 23 to 27, the vertical length LG1 of the active contact AC formed in the source/drain pattern SD1 or SD2 may be adjustable during the forming method of the active contact AC. This is because the selectivity between the source/drain pattern SD1 or SD2 and the blocking layer BL is utilized to selectively remove a portion (e.g., the second or fourth layer SEL2 or SEL4) of the source/drain pattern SD1 or SD2.

In a semiconductor device according to an embodiment of inventive concepts, the bottommost portion of an active contact may be located at a level lower than a top surface of the lowermost one of the semiconductor patterns. Since the active contact is deeply formed at a position close to a bottom surface of a source/drain pattern, a contact area between the active contact and the source/drain pattern may be increased, and as a result, a contact resistance therebetween may be reduced. Furthermore, a recess depth of the source/drain pattern may be adjusted using an etch selectivity, which is caused by a variation in germanium concentration of the source/drain pattern. Accordingly, it may be possible to control a length of the active contact, which is formed on the source/drain pattern. In addition, an impurity region may be formed near a contact surface between the source/drain pattern and the active contact, and this may make it possible to lower the contact resistance between the source/drain pattern and the active contact. As a result, the electrical and reliability characteristics of the semiconductor device may be improved.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:

a substrate;

a channel pattern on the substrate, the channel pattern including a plurality of semiconductor patterns, the plurality of semiconductor patterns being vertically stacked and spaced apart from each other, and a lowermost one of the plurality of semiconductor patterns being a first semiconductor pattern, a source/drain pattern connected to the plurality of semiconductor patterns;

an interlayer insulating layer on the source/drain pattern;

an active contact penetrating the interlayer insulating layer and being electrically connected to the source/drain pattern, wherein the source/drain pattern includes a first layer connected to the plurality of semiconductor patterns and a second layer interposed between the first layer and the active contact, a level of a topmost surface of the second layer is lower than a level of a bottommost surface of the active contact, and the level of the bottommost surface of the active contact is lower than a level of a top surface of the first semiconductor pattern.

2. The semiconductor device of claim 1, further comprising:

an intermediate layer between the active contact and the source/drain pattern.

3. The semiconductor device of claim 2, wherein the active contact comprises a conductive pattern and a barrier pattern enclosing the conductive pattern, and the barrier pattern is between the intermediate layer and the conductive pattern.

4. The semiconductor device of claim 2, wherein a mean thickness of the intermediate layer is smaller than a mean thickness of the source/drain pattern.

5. The semiconductor device of claim 2, wherein the intermediate layer comprises at least one of titanium-silicide, tantalum-silicide, tungsten-silicide, nickel-silicide, or cobalt-silicide.

6. The semiconductor device of claim 2, wherein the source/drain pattern is in a PMOSFET region of the semiconductor device, the second layer of the source/drain pattern is on the first layer of the source/drain pattern, the second layer comprises a concave top surface, the intermediate layer is between the concave top surface of the second layer and the active contact, and the intermediate layer is between an inner surface of the first layer and the active contact.

7. The semiconductor device of claim 6, wherein a germanium concentration of the second layer is higher than a germanium concentration of the first layer.

8. The semiconductor device of claim 1, wherein a concentration of an impurity in the source/drain pattern increases as a distance to the active contact decreases.

9. The semiconductor device of claim 8, wherein the source/drain pattern is in a PMOSFET region of the semiconductor device, and the impurity comprises at least one of boron (B), gallium (Ga), or indium (In).

10. A semiconductor device, comprising:

a substrate including an active region;

a source/drain pattern on the active region, the source/drain pattern including a first inner surface, the source/drain pattern being among a plurality of source/drain patterns;

channel patterns on the active region and connected to the plurality of source/drain patterns, each of the channel patterns including a plurality of semiconductor patterns, the plurality of semiconductor patterns being vertically stacked and spaced apart from each other, and a lowermost one of the plurality of semiconductor patterns being a first semiconductor pattern;

gate electrodes on the channel patterns, respectively;

an active contact electrically connected to the source/drain pattern; and an intermediate layer on the first inner surface, wherein the active contact is on the intermediate layer, the source/drain pattern includes a first layer connected to the plurality of semiconductor patterns and a second layer interposed between the first layer and the active contact, a level of a topmost surface of the second layer is lower than a level of a bottommost surface of the active contact, and a level of a bottom surface of the first inner surface is lower than a top surface of the first semiconductor pattern.

11. The semiconductor device of claim 10, wherein a concentration of an impurity in the source/drain pattern increases as a distance to the active contact decreases.

12. The semiconductor device of claim 11, wherein the source/drain pattern is in a PMOSFET region of the semiconductor device, and the impurity comprises at least one of boron (B), gallium (Ga), or indium (In).

13. The semiconductor device of claim 10, wherein the source/drain pattern is in a PMOSFET region of the semiconductor device, the second layer of the source/drain pattern is on the first layer of the source/drain pattern, the second layer has a concave top surface, the intermediate layer is between the concave top surface of the second layer and the active contact, the intermediate layer is between an inner surface of the first layer and the active contact, and a germanium concentration of the second layer is higher than a germanium concentration of the first layer.

14. A semiconductor device, comprising:

a substrate including an active region;

a device isolation layer on the active region, the device isolation layer defining an active pattern on the active region;

a channel pattern on the active pattern, the channel pattern including a plurality of semiconductor patterns, the plurality of semiconductor patterns being vertically stacked and spaced apart from each other, a lowermost one of the plurality of semiconductor patterns being a first semiconductor pattern;

a source/drain pattern on the active pattern;

a gate electrode on the plurality of semiconductor patterns, the gate electrode including a portion interposed between adjacent semiconductor patterns among the plurality of semiconductor patterns;

a gate insulating layer between the adjacent semiconductor patterns and the portion of the gate electrode;

an inner spacer between the gate insulating layer and the source/drain pattern;

a gate spacer on a side surface of the gate electrode;

a gate capping pattern on a top surface of the gate electrode;

an interlayer insulating layer on the gate capping pattern;

an active contact penetrating the interlayer insulating layer and being electrically connected to the source/drain pattern;

a metal layer between the active contact and the source/drain pattern;

a gate contact penetrating the interlayer insulating layer and the gate capping pattern, the gate contact being electrically connected to the gate electrode;

a first metal layer on the interlayer insulating layer, the first metal layer including a power line and a first interconnection line, the power line and the first interconnection line being electrically connected to the active contact and gate contact; and a second metal layer on the first metal layer, the second metal layer includes second interconnection lines electrically connected to the first metal layer, the source/drain pattern include a first layer connected to the plurality of semiconductor patterns and a second layer interposed between the first layer and the active contact, a level of a topmost surface of the second layer is lower than a level of a bottommost surface of the active contact, and a level of a lowermost portion of the active contact is lower than a level of a top surface of the first semiconductor pattern.

15. The semiconductor device of claim 14, further comprising:

an intermediate layer between the active contact and the source/drain pattern.

16. The semiconductor device of claim 14, wherein a concentration of an impurity in the source/drain pattern increases as a distance to the active contact decreases.

17. The semiconductor device of claim 16, wherein the source/drain pattern is in a PMOSFET region of the semiconductor device, and the impurity includes at least one of boron (B), gallium (Ga), or indium (In).

* * * * *